(12) United States Patent
Arayashiki et al.

(10) Patent No.: US 10,546,896 B2
(45) Date of Patent: Jan. 28, 2020

(54) STORAGE DEVICE HAVING VARIABLE RESISTANCE LAYER

(71) Applicant: TOSHIBA MEMORY CORPORATION, Minato-ku, Tokyo (JP)

(72) Inventors: Yusuke Arayashiki, Yokkaichi Mie (JP); Kouji Matsuo, Ama Aichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/696,875

(22) Filed: Sep. 6, 2017

(65) Prior Publication Data

US 2018/0277597 A1    Sep. 27, 2018

(30) Foreign Application Priority Data

Mar. 24, 2017  (JP) ................. 2017-060011

(51) Int. Cl.
*H01L 27/24*    (2006.01)
*H01L 45/00*    (2006.01)
*G11C 13/00*    (2006.01)

(52) U.S. Cl.
CPC .......... *H01L 27/249* (2013.01); *H01L 45/065* (2013.01); *H01L 45/1226* (2013.01); *H01L 45/1246* (2013.01); *H01L 45/1253* (2013.01); *H01L 45/144* (2013.01); *H01L 45/1616* (2013.01); *H01L 45/1675* (2013.01); *H01L 45/1683* (2013.01); *G11C 13/004* (2013.01); *G11C 13/0026* (2013.01); *G11C 13/0028* (2013.01)

(58) Field of Classification Search
CPC ...................... H01L 27/249; H01L 45/06–149
See application file for complete search history.

(56) References Cited

U.S. PATENT DOCUMENTS

| 9,385,320 | B2 | 7/2016 | Sasago et al. | |
| 9,437,296 | B2 | 9/2016 | Kanno et al. | |
| 2007/0189065 | A1* | 8/2007 | Suh ................... | G11C 13/0004 365/163 |
| 2011/0261607 | A1* | 10/2011 | Tang .................. | G11C 13/0007 365/148 |
| 2015/0325628 | A1 | 11/2015 | Nonoguchi et al. | |
| 2016/0126292 | A1 | 5/2016 | Yanagida et al. | |
| 2018/0269216 | A1* | 9/2018 | Lee ..................... | H01L 27/2463 |

\* cited by examiner

*Primary Examiner* — Robert T Huber
*Assistant Examiner* — Gardner W. S. Swan
(74) *Attorney, Agent, or Firm* — Foley & Lardner LLP

(57) ABSTRACT

A storage device includes a first conductive layer, a second conductive layer, a third conductive layer, a fourth conductive layer, a fifth conductive layer, and a sixth conductive layer. The storage device further includes a first variable resistance layer provided between the first and fifth conductive layers, a second variable resistance layer provided between the second and fifth conductive layers, a third variable resistance layer provided between the third and fifth conductive layers, and a fourth variable resistance layer provided between the first and sixth conductive layers. A first distance between the first and second variable resistance layers is shorter than a second distance between a portion of the first conductive layer and a portion of the second conductive layer which face each other across a region between the fifth and sixth conductive layers.

8 Claims, 18 Drawing Sheets

STORAGE DEVICE HAVING VARIABLE RESISTANCE LAYER

CROSS-REFERENCE TO RELATED APPLICATION

This application claims the benefit of and priority to Japanese Patent Application No. 2017-060011, filed Mar. 24, 2017, the entire contents of which are incorporated herein by reference.

FIELD

One or more embodiments described herein relate generally to a storage device.

BACKGROUND

With miniaturization of variable resistance memories, distances between adjacent memory cells can be shortened, and thus mutual interference between the adjacent memory cells can be problematic. The mutual interference between the adjacent memory cells can be a cause of an erroneous operation. For example, in phase-change memories in which resistivity of a high resistance state is relatively low, it can be desirable to prevent mutual interference between memory cells and stabilize characteristics of the memory cells.

In variable resistance memories, to change the variable resistance layer from a low resistance state to a high resistance state (a reset operation) or change the variable resistance layer from a high resistance state to a low resistance state (a set operation), a current with a predetermined current density may be directed to the variable resistance layer. In particular, in phase-change memories, a high current density may be used for a reset operation. When the current density is insufficient, a reset operation can become unstable. It can be desirable to realize the stable reset operation and stabilize characteristics of memory cells.

DETAILED DESCRIPTION

Figure 1:
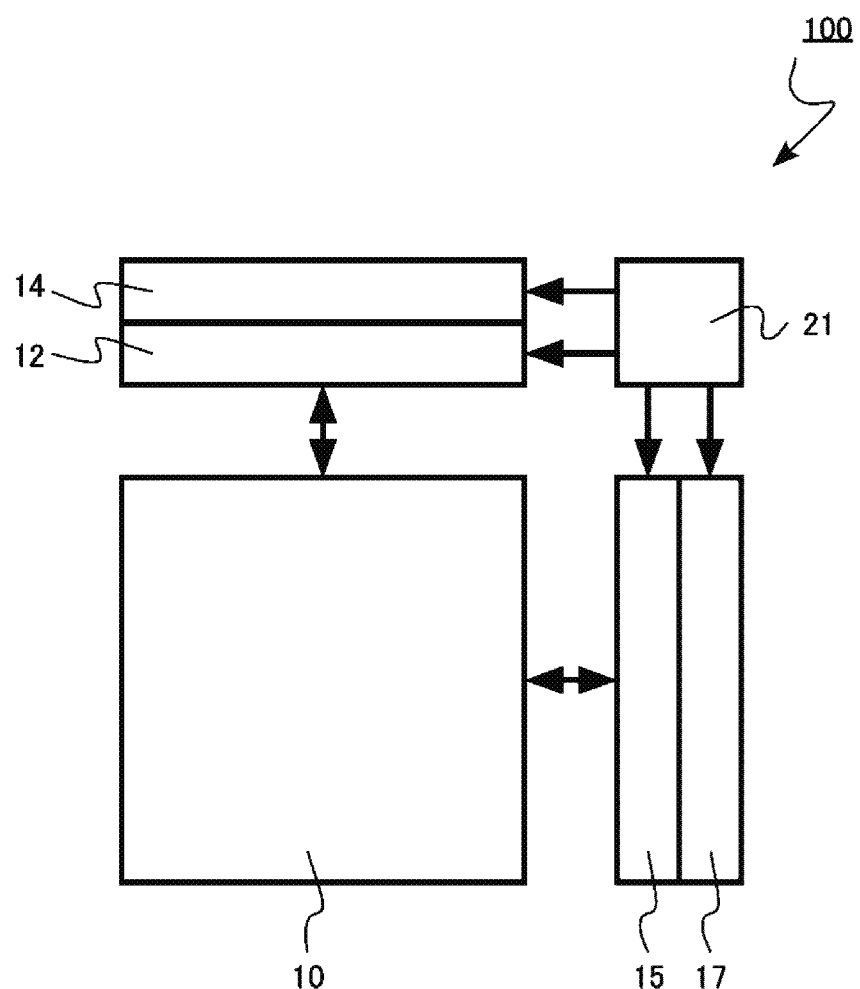
FIG. 1 is a block diagram illustrating one or more embodiments of a storage device according to a first aspect.

One or more embodiments described herein provide for a storage device capable of stabilizing characteristics of a memory cell.

Hereinafter, one or more embodiments of the present disclosure will be described with reference to the drawings. In the following description, the same reference numerals are assigned to the same or similar members or components and redundant descriptions of the members and components, once already described, may be appropriately omitted.

Hereinafter, a storage device according to one or more embodiments will be described.

First Aspect

According to an aspect of the present disclosure, one or more embodiments of a storage device include a first conductive layer extending in a first direction, a second conductive layer extending in the first direction, a third conductive layer extending in the first direction, and a fourth conductive layer extending in the first direction. The storage device further includes a fifth conductive layer extending in a second direction intersecting the first direction and provided between the first and second conductive layers and between the third and fourth conductive layers, and a sixth conductive layer extending in the second direction and provided between the first and second conductive layers and between the third and fourth conductive layers. The storage device yet further includes a first variable resistance layer provided between the first and fifth conductive layers, a second variable resistance layer provided between the second and fifth conductive layers, a third variable resistance layer provided between the third and fifth conductive layers, and a fourth variable resistance layer provided between the first and sixth conductive layers. The first variable resistance layer, the second variable resistance layer, the third variable resistance layer, and the fourth variable resistance layer are separated from each other. A first distance between the first and second variable resistance layers is shorter than a second distance between a portion of the first conductive layer and a portion of the second conductive layer which face each other across a region between the fifth and sixth conductive layers.

According to another aspect of the present disclosure, one or more embodiments of a storage device include a first conductive layer extending in a first direction, a second conductive layer extending in the first direction, a third conductive layer extending in the first direction, and a fourth conductive layer extending in the first direction. The storage device further includes a fifth conductive layer extending in a second direction intersecting the first direction and provided between the first and second conductive layers and between the third and fourth conductive layers, and a sixth conductive layer extending in the second direction and provided between the first and second conductive layers and between the third and fourth conductive layers. The storage device yet further includes a first variable resistance layer provided between the first and fifth conductive layers, between the second and fifth conductive layers, between the third and fifth conductive layers, and between the fourth and fifth conductive layers, and a second variable resistance layer provided between the first and sixth conductive layers, between the second and sixth conductive layers, between the third and sixth conductive layers, and between the fourth and sixth conductive layers. A first distance between a portion of the first conductive layer and a portion of the second conductive layer which face each other with the fifth conductive layer interposed therebetween is shorter than a second distance between another part of the first conductive layer and another part of the second conductive layer which face each other across a region between the fifth and sixth conductive layers. The portion of the first conductive layer is a first projection region and a width of the fifth conductive layer in the first direction is less than a width of the first projection region in the first direction.

Figure 2:
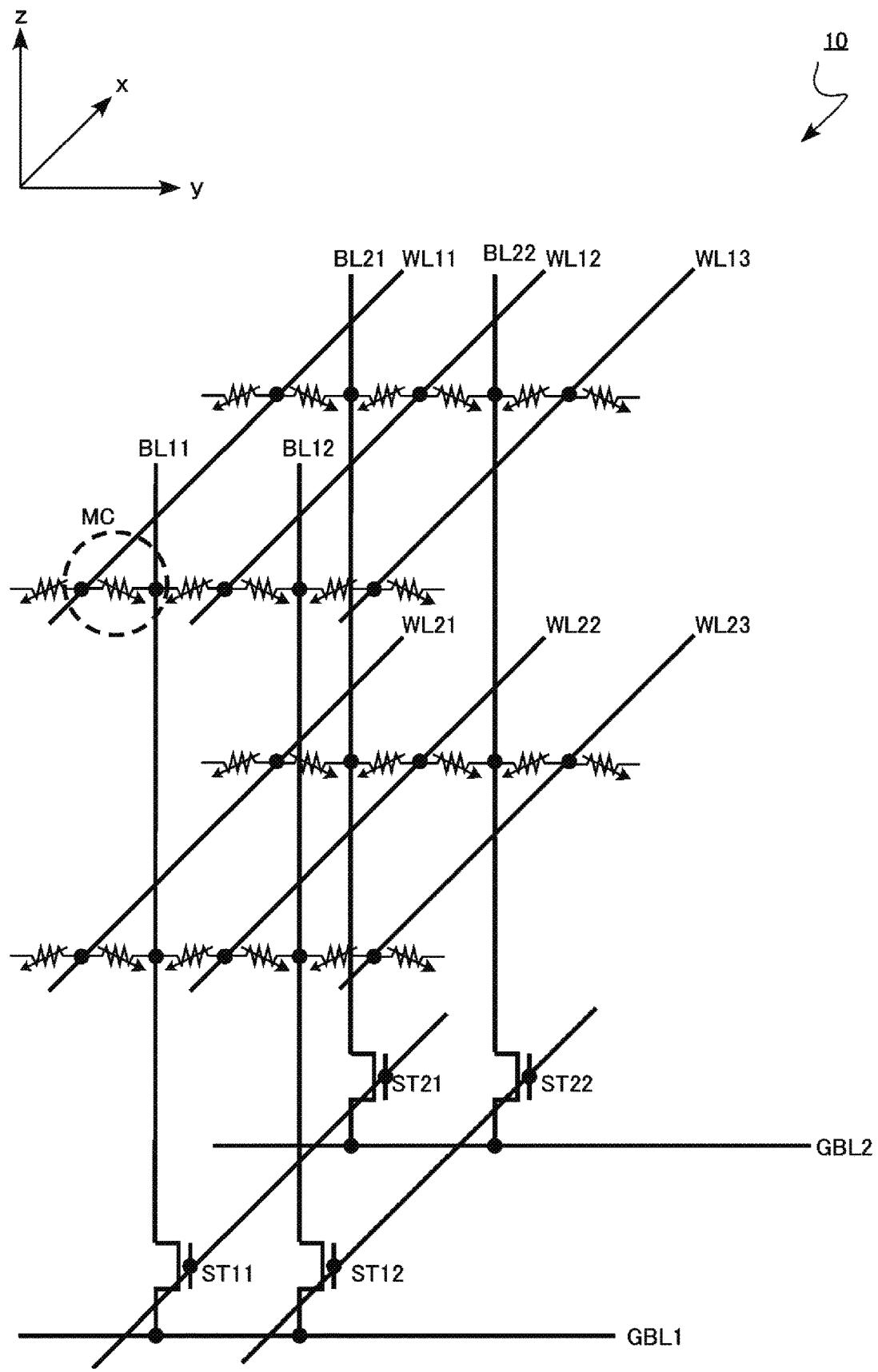
FIG. 2 is an equivalent circuit diagram illustrating one or more embodiments of a memory cell array according to the first aspect.

FIG. 1 is a block diagram illustrating one or more embodiments of a storage device according to the first aspect. FIG. 2 is an equivalent circuit diagram illustrating a memory cell array. FIG. 2 schematically illustrates a wiring structure in the memory cell array.

In one or more embodiments, a storage device 100 according to the first aspect is a phase-change memory. The phase-change memory stores data using a variable resistance accompanied by a change in a crystalline structure of a variable resistance layer.

In one or more embodiments, the memory cell array according to the first aspect has a 3-dimensional structure in which memory cells MC are disposed 3-dimensionally. Since the memory cell array has the 3-dimensional structure, an integration degree of the storage device 100 is improved.

As illustrated in FIG. 1, the storage device 100 includes a memory cell array 10, a word line driver circuit 12, a row decoder circuit 14, a sense amplifier 15, a column decoder circuit 17, and a control circuit 21.

As illustrated in FIG. 2, a plurality of memory cells MC are disposed 3-dimensionally inside the memory cell array 10. In FIG. 2, a region surrounded by a dotted line corresponds to one memory cell MC.

The memory cell array 10 includes, for example, a plurality of word lines WL (WL11, WL12, W13, WL21, WL22, and WL23) and a plurality of bit lines BL (BL11, BL12, BL21, and BL22). The word lines WL extend in an x direction. The bit lines BL extend in a z direction. The word lines WL and the bit lines BL intersect. The memory cells MC are disposed at, or are constituted at least in part by, intersections of the word lines WL and the bit lines BL.

The word line WL11 is a specific example of a first conductive layer, the word line WL12 is a specific example of a second conductive layer, the word line WL21 is a specific example of a third conductive layer, the word line WL22 is a specific example of a fourth conductive layer, and the bit line BL11 is a specific example of a fifth conductive layer, and the bit line BL21 is a specific example of the sixth conductive layer. The x direction is a specific example of a first direction, a y direction is a specific example of a third direction, and the z direction is a specific example of a second direction. The x direction, the y direction, and the z direction may intersect each other (e.g. may be orthogonal to each other).

The plurality of word lines WL are electrically connected to the row decoder circuit 14. The plurality of bit lines BL are electrically connected to the sense amplifier 15. Select transistors ST (ST11, ST21, ST12, and ST22) and global bit lines GBL (GBL1 and GBL2) are provided between the plurality of bit lines BL and the sense amplifier 15.

The row decoder circuit 14 is configured to select the word line WL according to an input row address signal. The word line driver circuit 12 is configured to apply a predetermined voltage to the word line WL selected by the row decoder circuit 14.

The column decoder circuit 17 is configured to select the bit line BL according to an input column address signal. The sense amplifier 15 is configured to apply a predetermined voltage to the bit line BL selected by the column decoder circuit 17. The sense amplifier 15 is configured to detect and amplify a current flowing between the selected word line WL and the selected bit line BL.

The control circuit 21 is configured to control the word line driver circuit 12, the row decoder circuit 14, the sense amplifier 15, the column decoder circuit 17, and/or other circuits (not illustrated).

The circuits such as the word line driver circuit 12, the row decoder circuit 14, the sense amplifier 15, the column decoder circuit 17, and the control circuit 21 are configured with, for example, transistors and wiring layers implementing semiconductor layers (not illustrated).

Figure 3A:
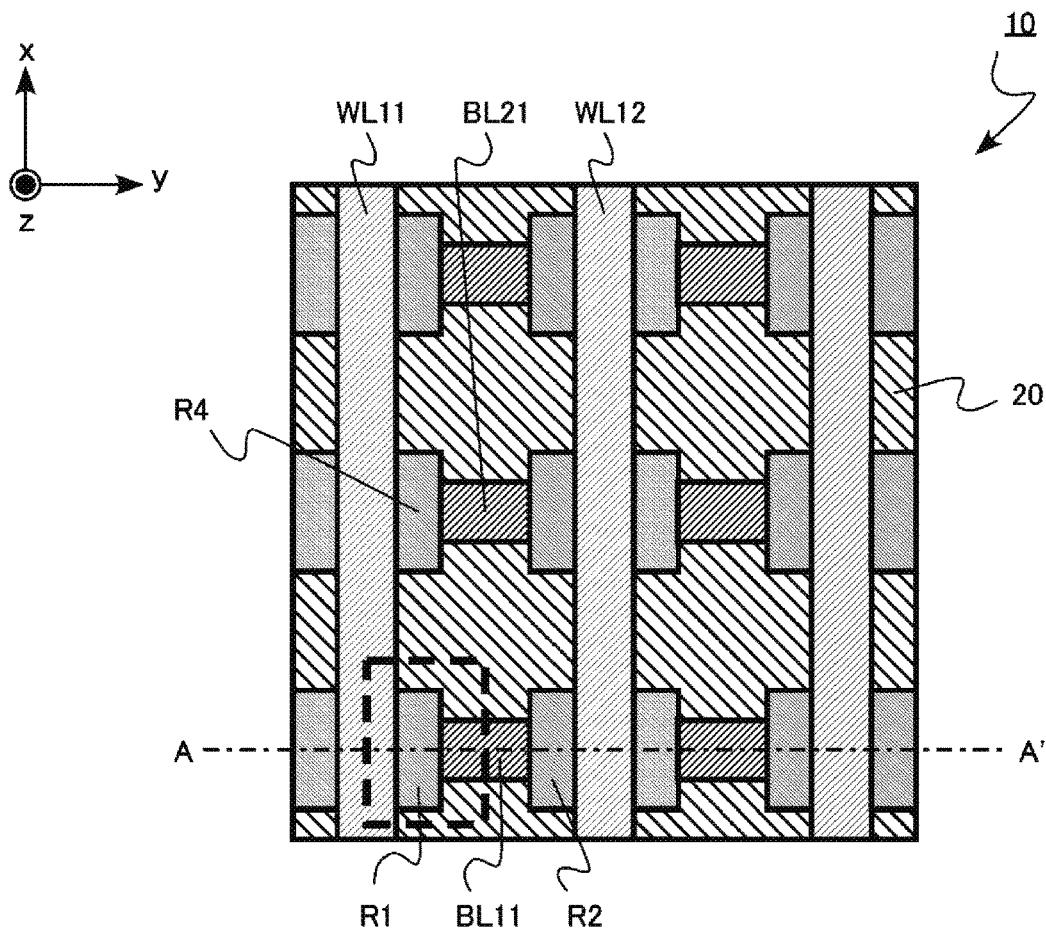
FIG. 3A and FIG. 3B are schematic sectional views illustrating one or more embodiments of the storage device according to the first aspect.
Figure 3B:
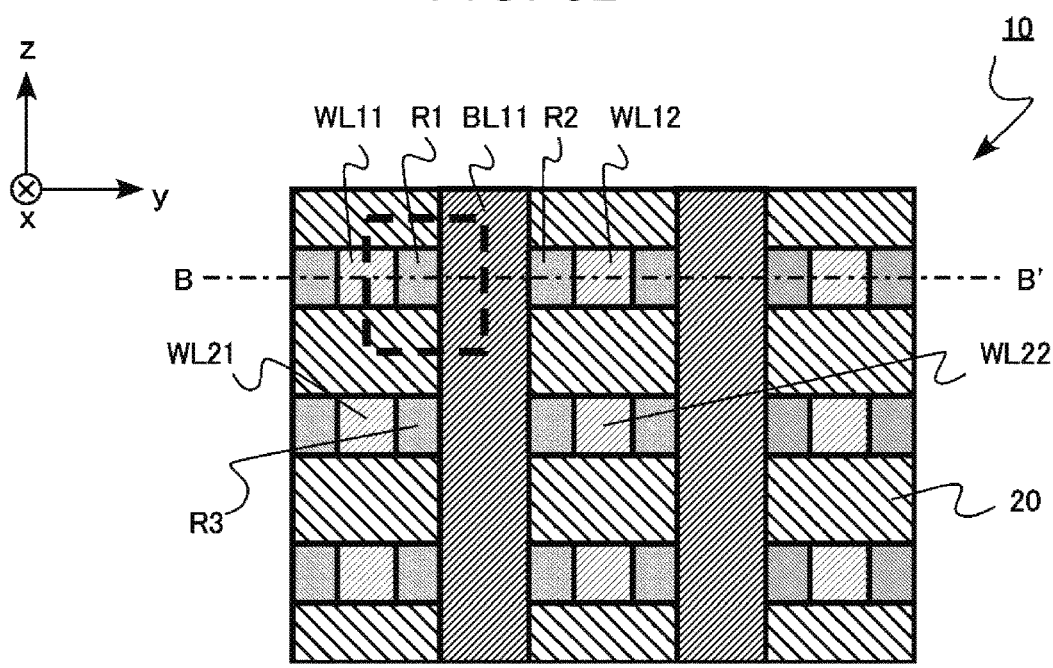

FIG. 3A and FIG. 3B are schematic sectional views illustrating one or more embodiments of the memory cell array 10 of the storage device 100 according to the first aspect. FIG. 3A is an xy sectional view illustrating the memory cell array 10. FIG. 3B is an yz sectional view illustrating the memory cell array 10. FIG. 3A is a sectional view taken along the line BB' in FIG. 3B and FIG. 3B is a sectional view taken along the line AA' in FIG. 3A. In FIG. 3A and FIG. 3B, a region surrounded by a dotted line is one memory cell MC.

The memory cell array 10 includes the word line WL11 (the first conductive layer), the word line WL12 (the second conductive layer), the word line WL21 (the third conductive layer), and the word line WL22 (the fourth conductive layer). The memory cell array 10 includes the bit line BL11 (the fifth conductive layer) and the bit line BL21 (the sixth conductive layer). The memory cell array 10 includes a first variable resistance layer R1, a second variable resistance layer R2, a third variable resistance layer R3, and a fourth variable resistance layer R4. The memory cell array 10 includes interlayer insulating layers 20.

Hereinafter, the "word lines WL" will be used as a generic term to refer to at least one of the word line WL11 (the first conductive layer), the word line WL12 (the second conductive layer), the word line WL21 (the third conductive layer), the word line WL22 (the fourth conductive layer), in some cases. The "bit lines BL" will be used as a generic term to refer to at least one of the bit line BL11 and the bit line BL21, in some cases. The "variable resistance layers R" will be used as a generic term to refer to at least one of the first variable resistance layer R1, the second variable resistance layer R2, the third variable resistance layer R3, and the fourth variable resistance layer R4, in some cases.

The word lines WL are conductive layers. The word lines WL include, for example, metal layers. The word lines WL include, for example, tungsten (W) or titanium nitride (TiN). The word lines WL may include a conductive material such as a metal, a metal semiconductor compound, or a semiconductor.

The bit lines BL are conductive layers. The bit lines BL include, for example, metal layers. The bit lines BL include, for example, tungsten (W), titanium nitride (TiN), or copper (Cu). The bit lines BL may include a conductive material such as a metal, a metal semiconductor compound, or a semiconductor.

For example, a resistivity of one or more of the word lines WL is lower than a resistivity of one or more of the bit lines BL. For example, when titanium nitride is used for the bit lines, tungsten with a lower resistivity than titanium nitride is used for the word lines WL.

A pitch of the word line WL is, for example, equal to or greater than about 50 nanometer (nm) and equal to or less than about 200 nm. A thickness of the word line WL in the z direction is, for example, equal to or less than about 20 nm. A pitch of the bit line BL is, for example, equal to or greater than about 50 nm and equal to or less than about 200 nm.

The pitch of the word line WL, the thickness of the word line WL in the z direction, and the pitch of the bit line BL can be measured, for example, through observation with a transmission electron microscope.

The interlayer insulating layers 20 are provided between the word line WL11, the word line WL12, the word line WL21, and the word line WL22. The interlayer insulating layer 20 is provided between the bit lines BL11 and BL21. The interlayer insulating layer 20 includes, for example, an oxide, an oxynitride, or a nitride. The interlayer insulating layer 20 includes, for example, a silicon oxide.

The first variable resistance layer R1 is provided between the word line WL11 and the bit line BL11. The second variable resistance layer R2 is provided between the word line WL12 and the bit line BL11. The third variable resistance layer R3 is provided between the word line WL21 and the bit line BL11. The fourth variable resistance layer R4 is provided between the word line WL11 and the bit line BL21.

The first variable resistance layer R1, the second variable resistance layer R2, the third variable resistance layer R3, and the fourth variable resistance layer R4 are separated from each other. The interlayer insulating layers 20 are interposed between the first variable resistance layer R1, the second variable resistance layer R2, the third variable resistance layer R3, and the fourth variable resistance layer R4, respectively.

The variable resistance layer R is configured to store data in accordance with a change in a resistance state. The variable resistance layer R can rewrite data in accordance with application of a voltage or a current. The variable resistance layer R transitions between a high resistance state (a reset state) and a low resistance state (a set state) in accordance with application of a voltage or a current. For example, the high resistance state is defined as data "0" and the low resistance state is defined as data "1." The memory cell MC can store 1-bit data (a "0" or a "1"). By applying a voltage between the word line WL and the bit line BL, it is possible to change the resistance state of the variable resistance layer R.

The variable resistance layer R includes, for example, a chalcogen compound. The variable resistance layer R includes, for example, a chalcogen compound including at least one of germanium (Ge), antimony (Sb), and tellurium (Te). The variable resistance layer R includes, for example, a $Ge_2Sb_2Te_5$ alloy.

The variable resistance layer R transitions, for example, between an amorphous phase and a crystalline phase in accordance with application of a voltage or a current. The amorphous phase corresponds to the high resistance state. The crystalline phase corresponds to the low resistance state.

A film thickness of the variable resistance layer R is, for example, equal to or greater than about 3 nm and equal to or less than about 20 nm.

Figure 4:
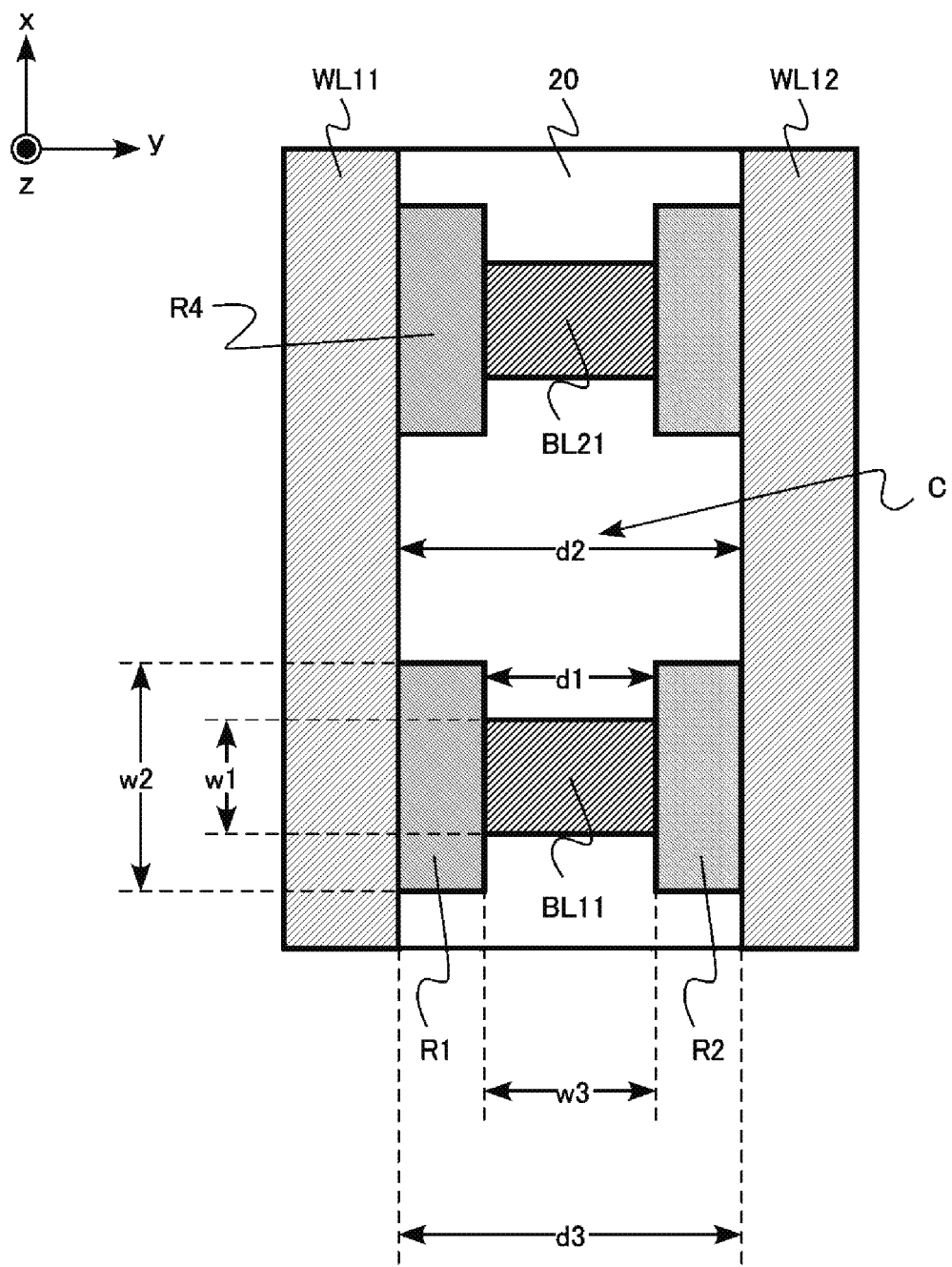
FIG. 4 is an expanded schematic sectional view illustrating one or more embodiments of the storage device according to the first aspect.
Figure 5A:
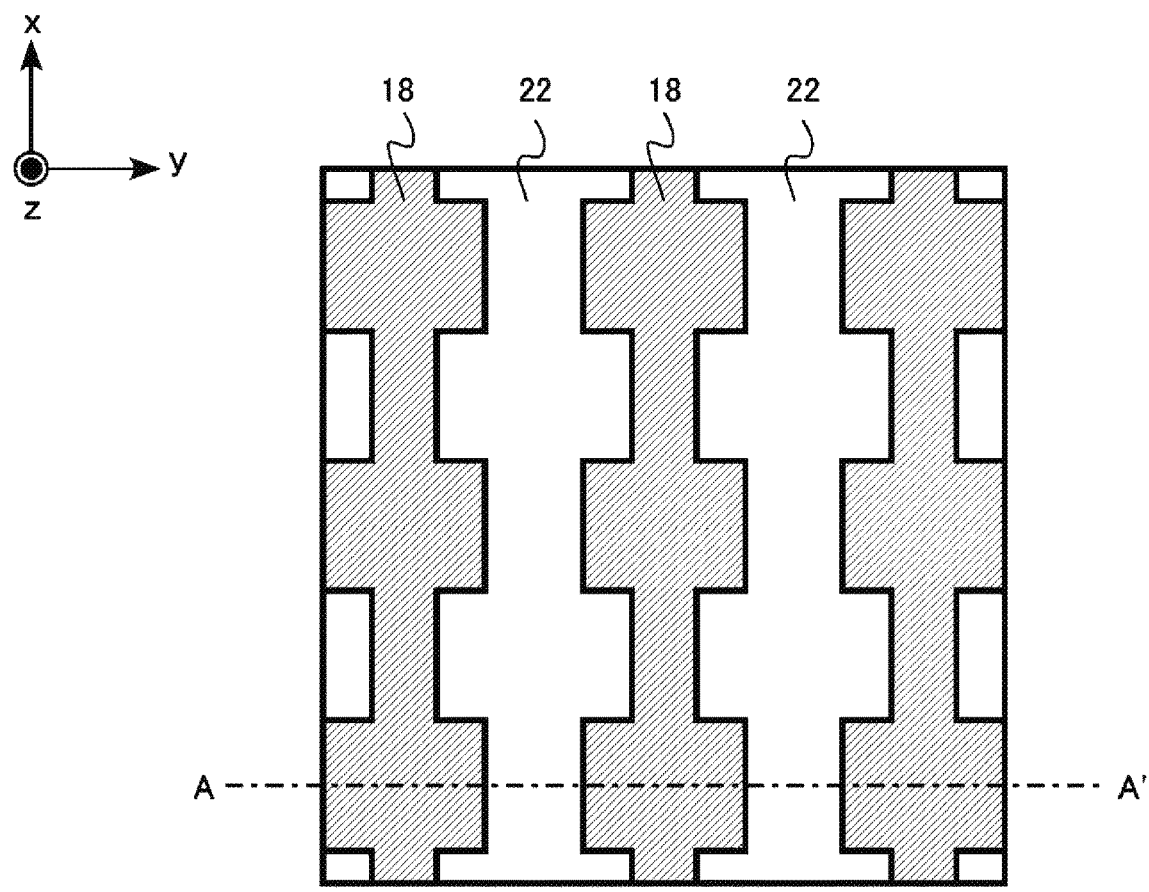
FIG. 5A and FIG. 5B are schematic sectional views illustrating one or more embodiments of the storage device during manufacturing in a method of manufacturing the storage device according to the first aspect.
Figure 5B:
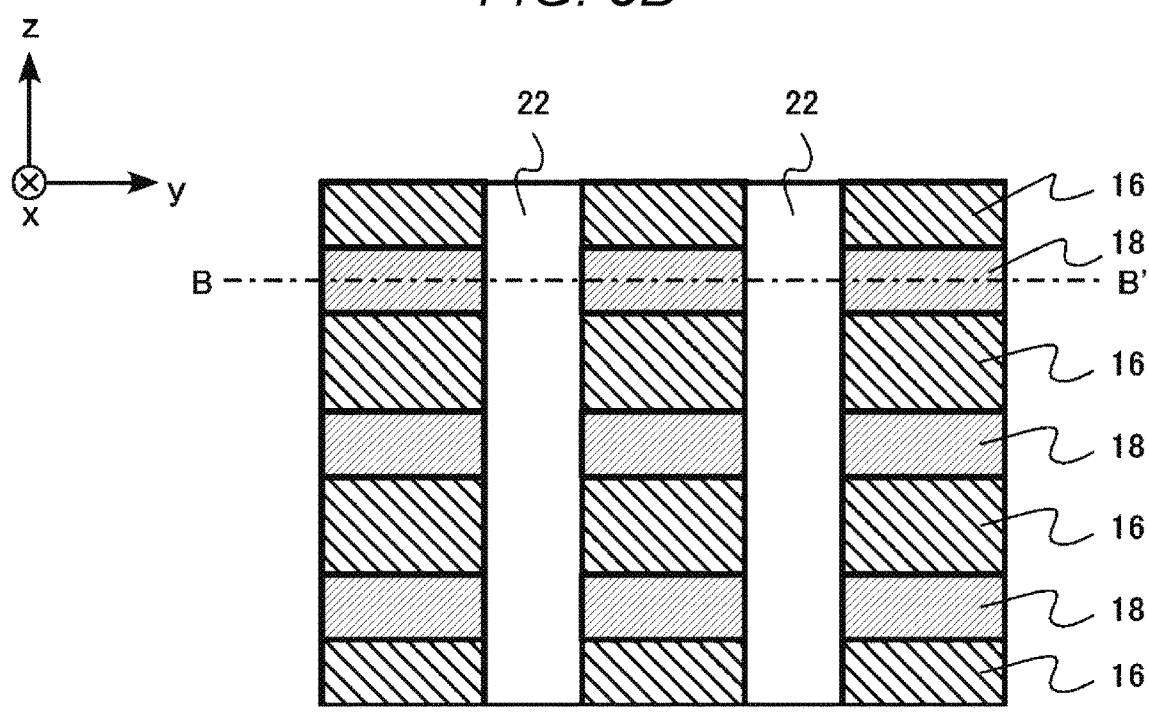

FIG. 4 is an expanded schematic sectional view illustrating one or more embodiments of the storage device according to the first aspect. FIG. 4 is an expanded schematic sectional view illustrating a region of FIG. 3A. A first distance (d1 in FIG. 4) between the first variable resistance layer R1 and the second variable resistance layer R2 is shorter than a second distance (d2 in FIG. 4) between a part of the word line WL11 and a part of the word line WL12 that face each other across a region (C in FIG. 4) provided between the bit lines BL11 and BL21. The second distance is, for example, equal to or shorter than about 50 nm.

A third distance (d3 in FIG. 4) between another part of the word line WL11 and another part of the word line WL12 which face each other with the bit line BL11 interposed therebetween is equal to or shorter than the second distance (d2 in FIG. 4).

A width of the bit line BL11 in the x direction (w1 in FIG. 4) is less than a width of the first variable resistance layer R1 in the x direction (w2 in FIG. 4). The width of the bit line BL11 in the x direction is, for example, equal to or less than about half of the width of the first variable resistance layer R1 in the x direction.

The width of the bit line BL11 in the x direction (w1 in FIG. 4) is less than a width of the bit line BL11 in the y direction (w3 in FIG. 4). The width of the bit line BL11 in the x direction is, for example, equal to or less than about half of the width of the bit line BL11 in the y direction.

Next, one or more embodiments of a method of manufacturing the storage device according to the first aspect will be described. FIG. 5A through FIG. 13B are schematic sectional views illustrating one or more embodiments of the storage device during manufacturing in the method of manufacturing the storage device according to the first aspect. FIG. 5A, FIG. 6A, FIG. 7A, FIG. 8A, FIG. 9A, FIG. 10A, FIG. 11A, FIG. 12A, and FIG. 13A are sectional views illustrating portions corresponding to a portion illustrated in FIG. 3A. FIG. 5B, FIG. 6B, FIG. 7B, FIG. 8B, FIG. 9B, FIG. 10B, FIG. 11B, FIG. 12B, and FIG. 13B are sectional views illustrating portions corresponding to a portion illustrated in FIG. 3B.

First, insulating films 16 and conductive films 18 are alternately stacked on a substrate (not illustrated). The insulating film 16 is, for example, a silicon oxide film and the conductive film 18 is, for example, a tungsten film. Next, the insulating films 16 and the conductive films 18 are patterned to form grooves 22 (see FIG. 5A and FIG. 5B). The grooves 22 are formed by, for example, a lithographic method and anisotropic dry etching. Patterning is performed so that side surfaces of the grooves 22 are uneven (e.g. define one or more indentations or recesses).

Figure 6A:
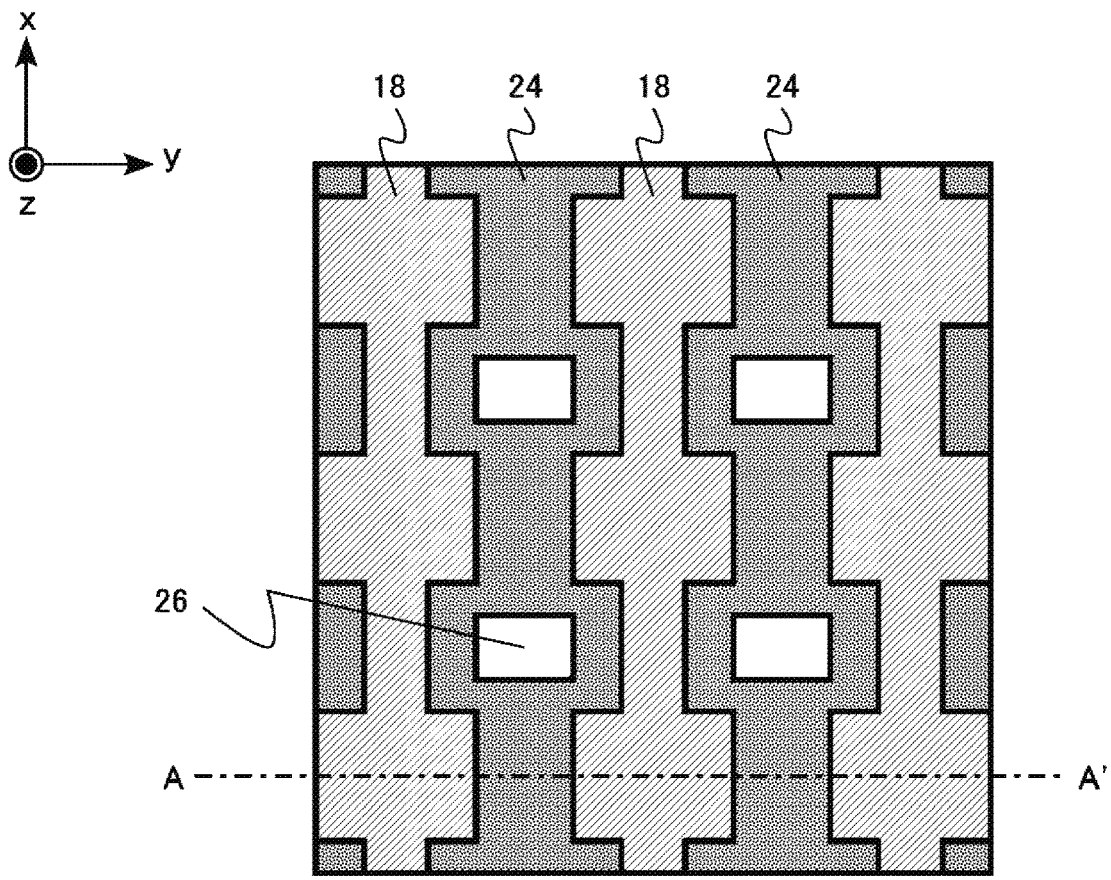
FIG. 6A and FIG. 6B are schematic sectional views illustrating one or more embodiments of the storage device during manufacturing in the method of manufacturing the storage device according to the first aspect.
Figure 6B:
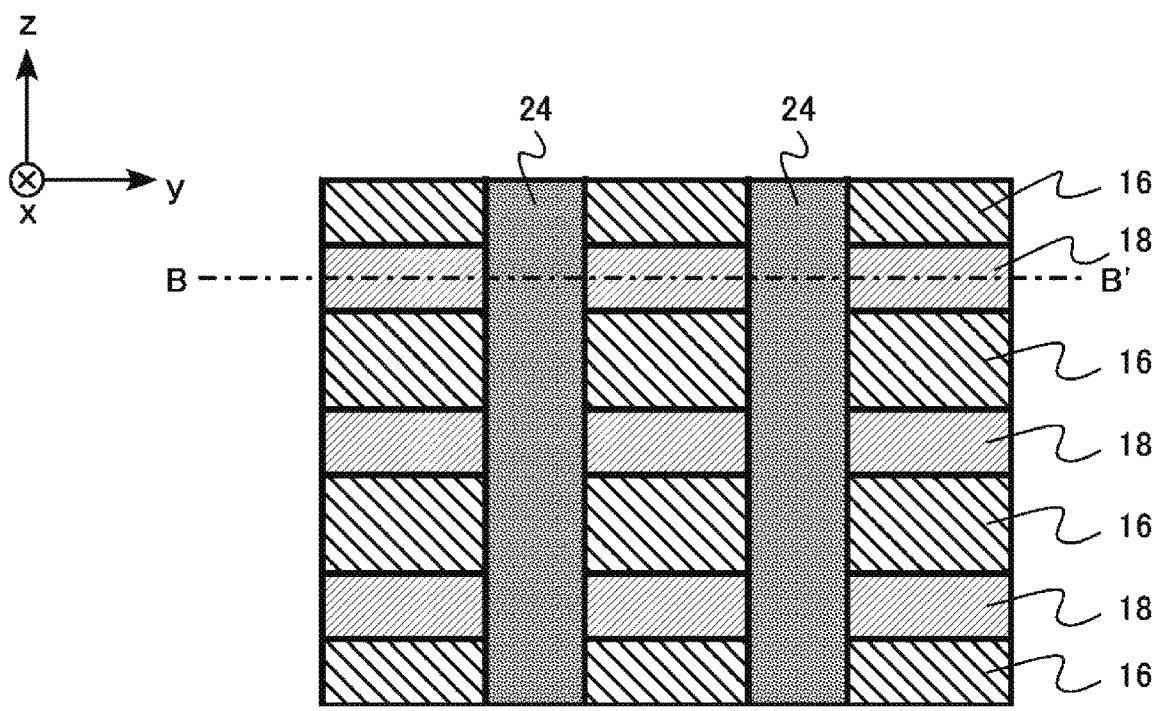

Subsequently, sacrificial films 24 are deposited inside the grooves 22 (see FIG. 6A and FIG. 6B). The sacrificial film 24 is, for example, a polycrystalline silicon film. The sacrificial film 24 is disposed so that one or more openings 26 are defined by in the sacrificial film 24. The sacrificial films 24 are deposited by, for example, a chemical vapor deposition method (CVD method).

Figure 7A:
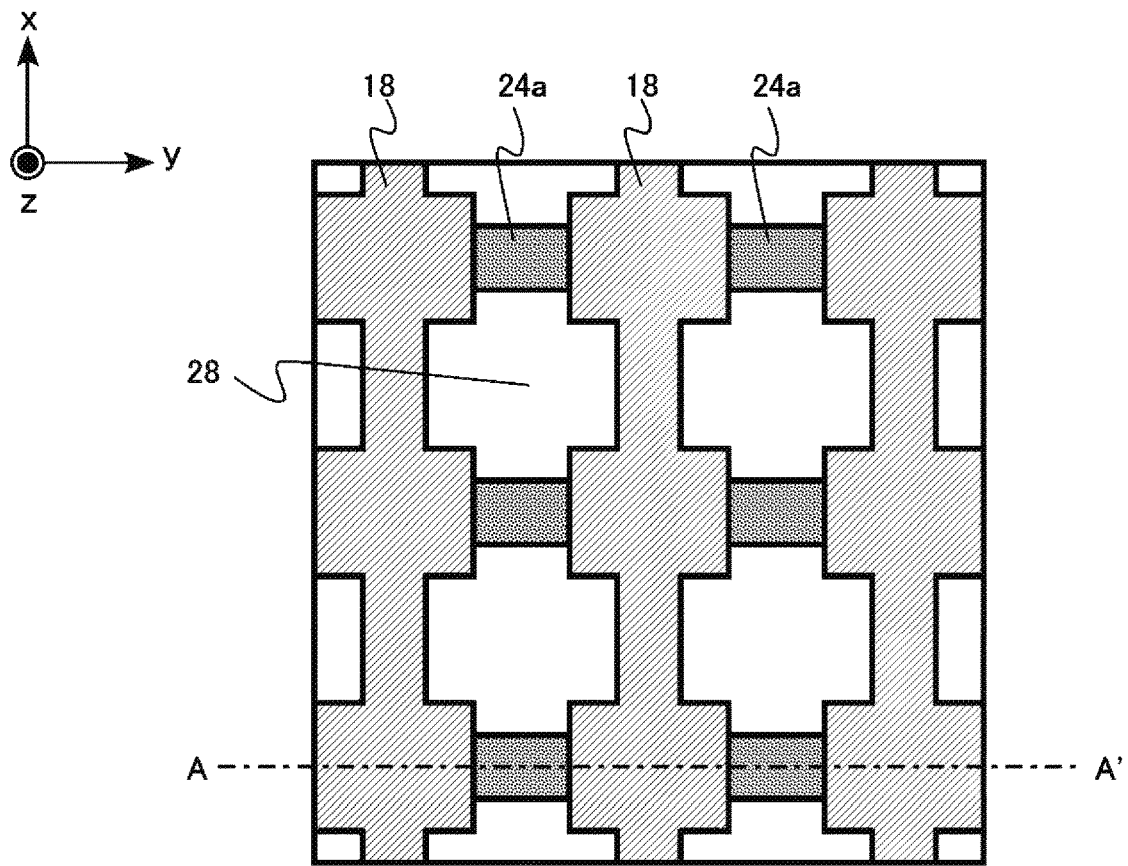
FIG. 7A and FIG. 7B are schematic sectional views illustrating one or more embodiments of the storage device during manufacturing in the method of manufacturing the storage device according to the first aspect.
Figure 7B:
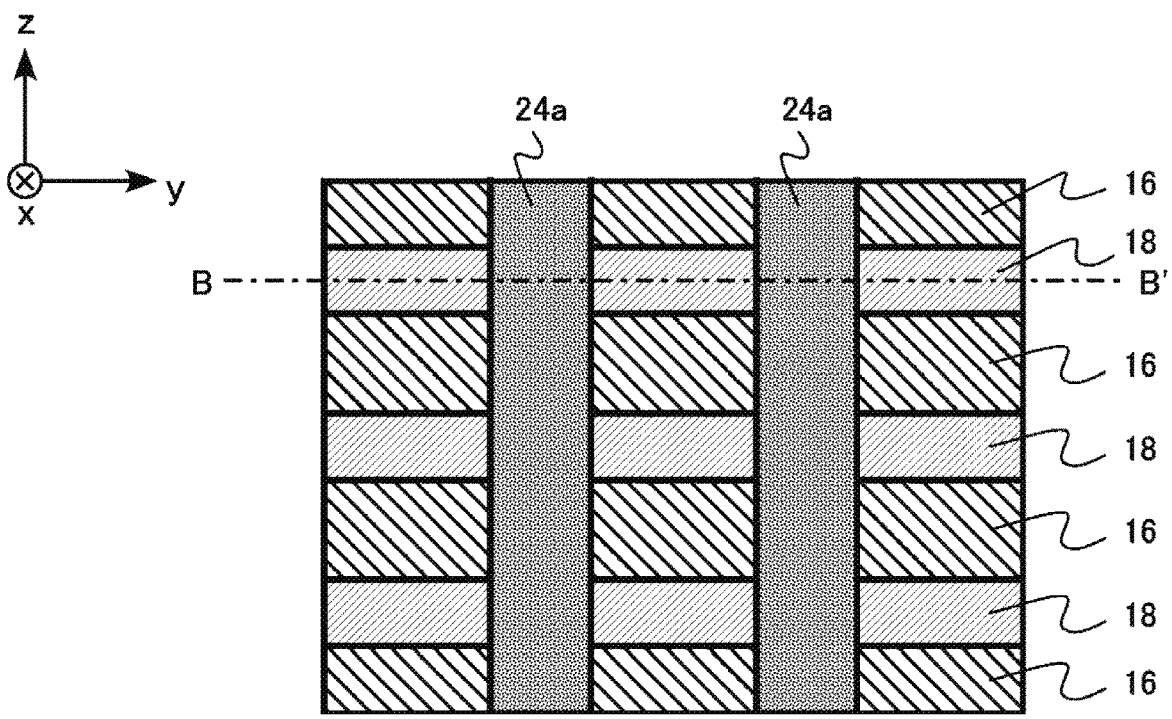

Subsequently, the sacrificial films 24 are isotropically etched to form openings 28 (e.g. by enlarging the openings 26) (see FIG. 7A and FIG. 7B). The etching is controlled to leave parts of the sacrificial films 24 that constitute at least part of pillar regions 24a. The etching of the sacrificial films 24 is performed by, for example, isotropic wet etching.

Figure 8A:
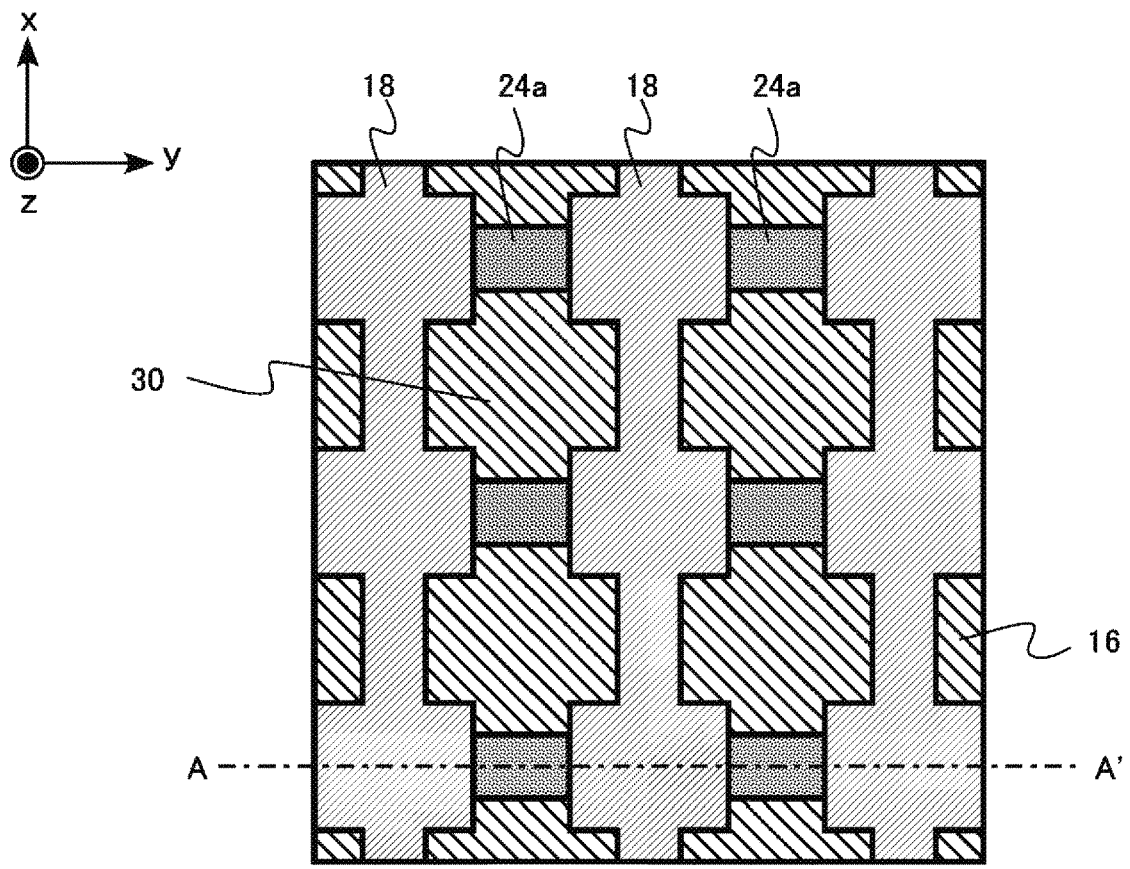
FIG. 8A and FIG. 8B are schematic sectional views illustrating one or more embodiments of the storage device during manufacturing in the method of manufacturing the storage device according to the first aspect.
Figure 8B:
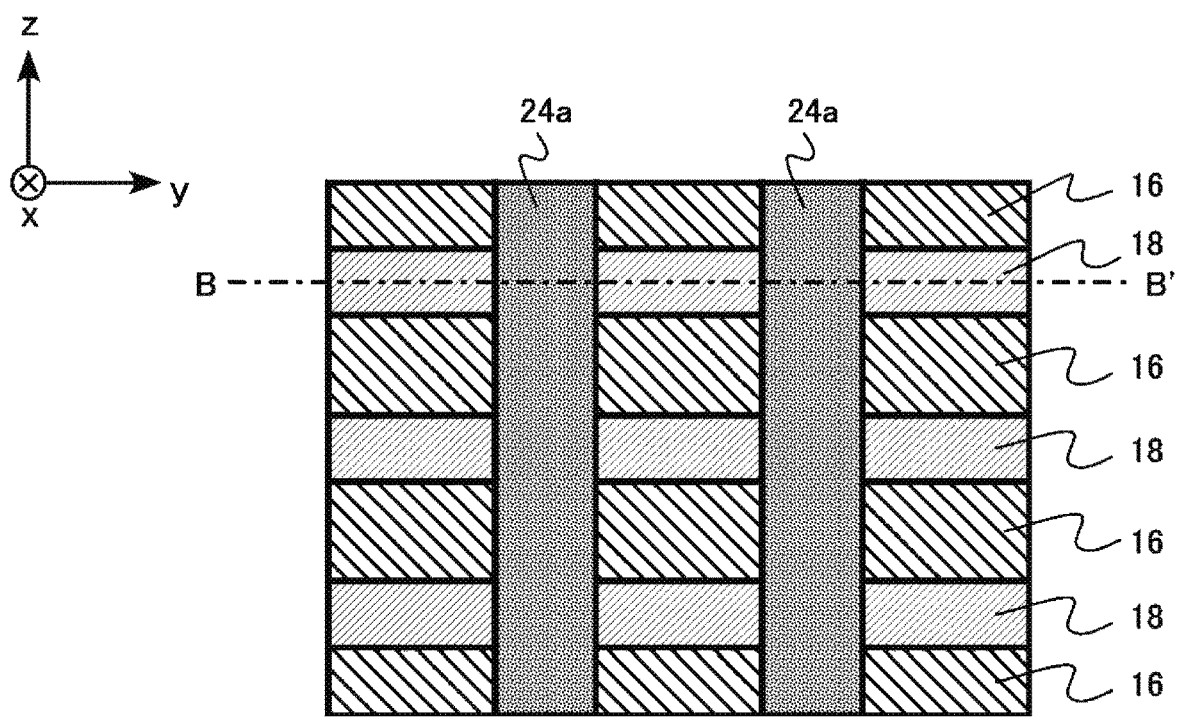

Subsequently, the insides of the openings 28 are at least partially filled with one or more insulating films 30 (see FIG. 8A and FIG. 8B). The insulating films 30 are, for example, silicon oxide films.

Subsequently, the pillar regions 24a are removed by etching to form openings 32 (see FIG. 9A and FIG. 9B). The etching of the pillar regions 24a is performed by, for example, isotropic wet etching.

Figure 10A:
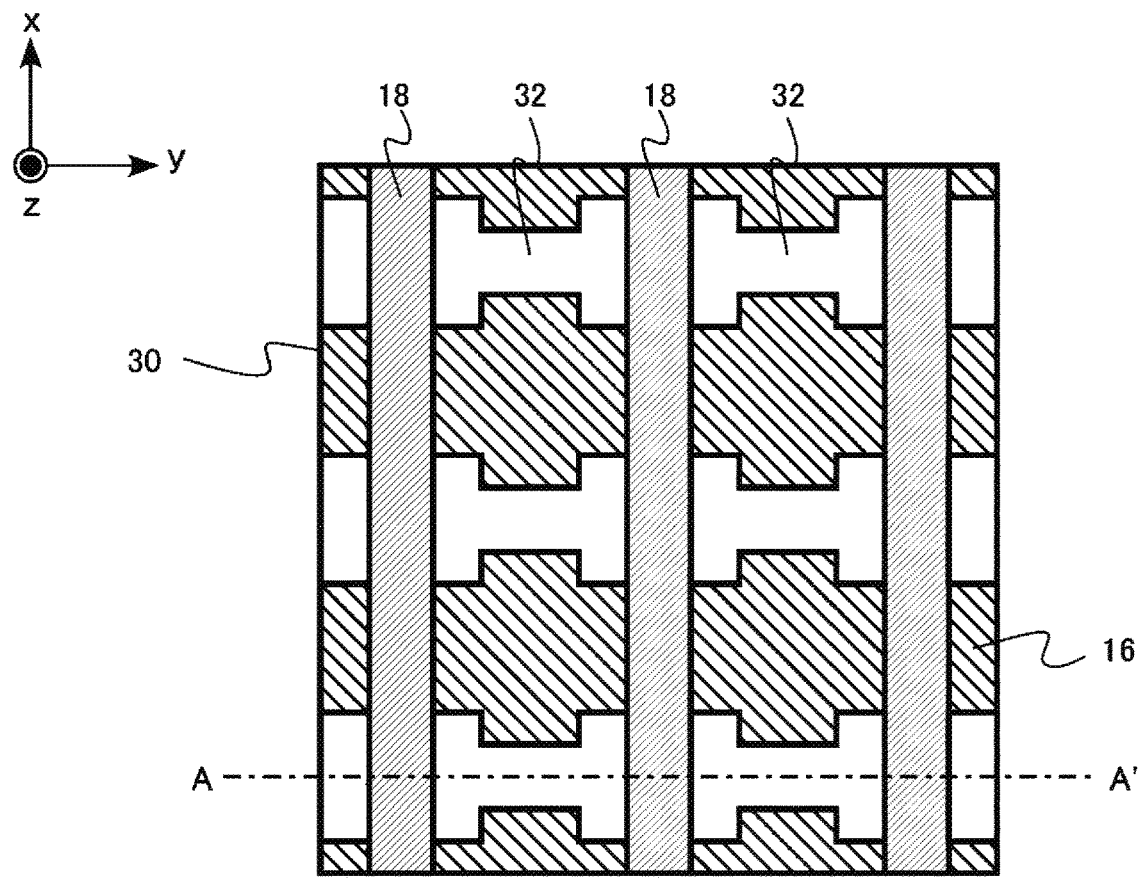
FIG. 10A and FIG. 10B are schematic sectional views illustrating one or more embodiments of the storage device during manufacturing in the method of manufacturing the storage device according to the first aspect.
Figure 10B:
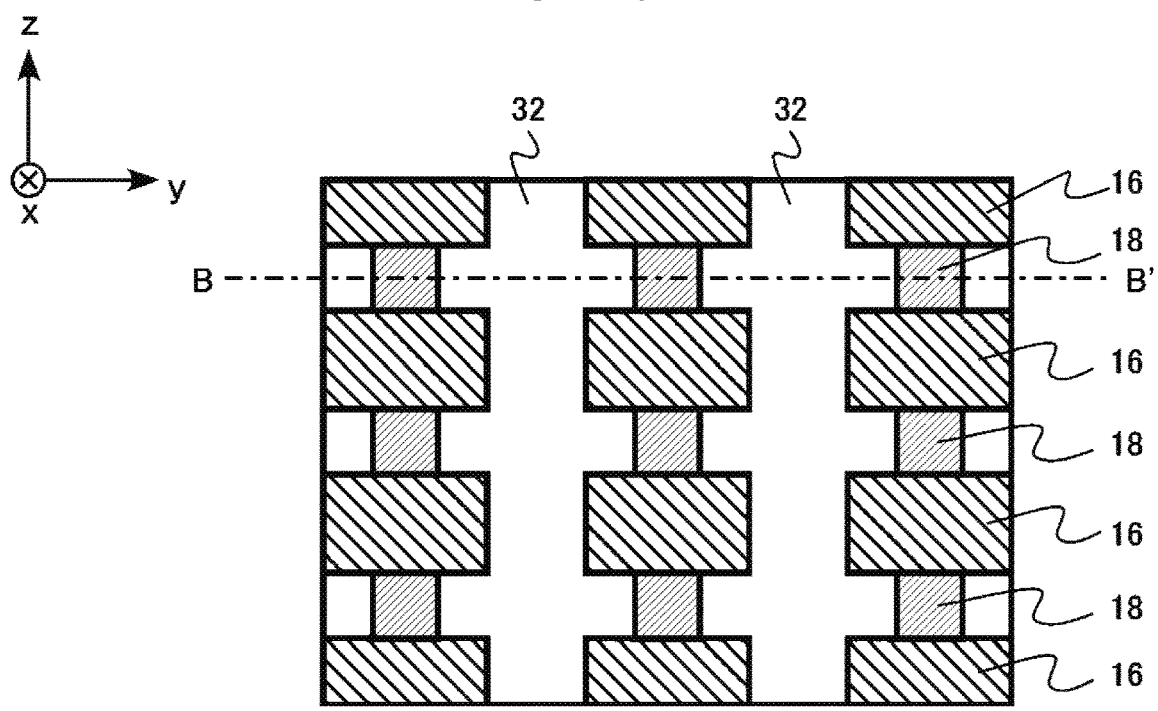
Figure 11A:
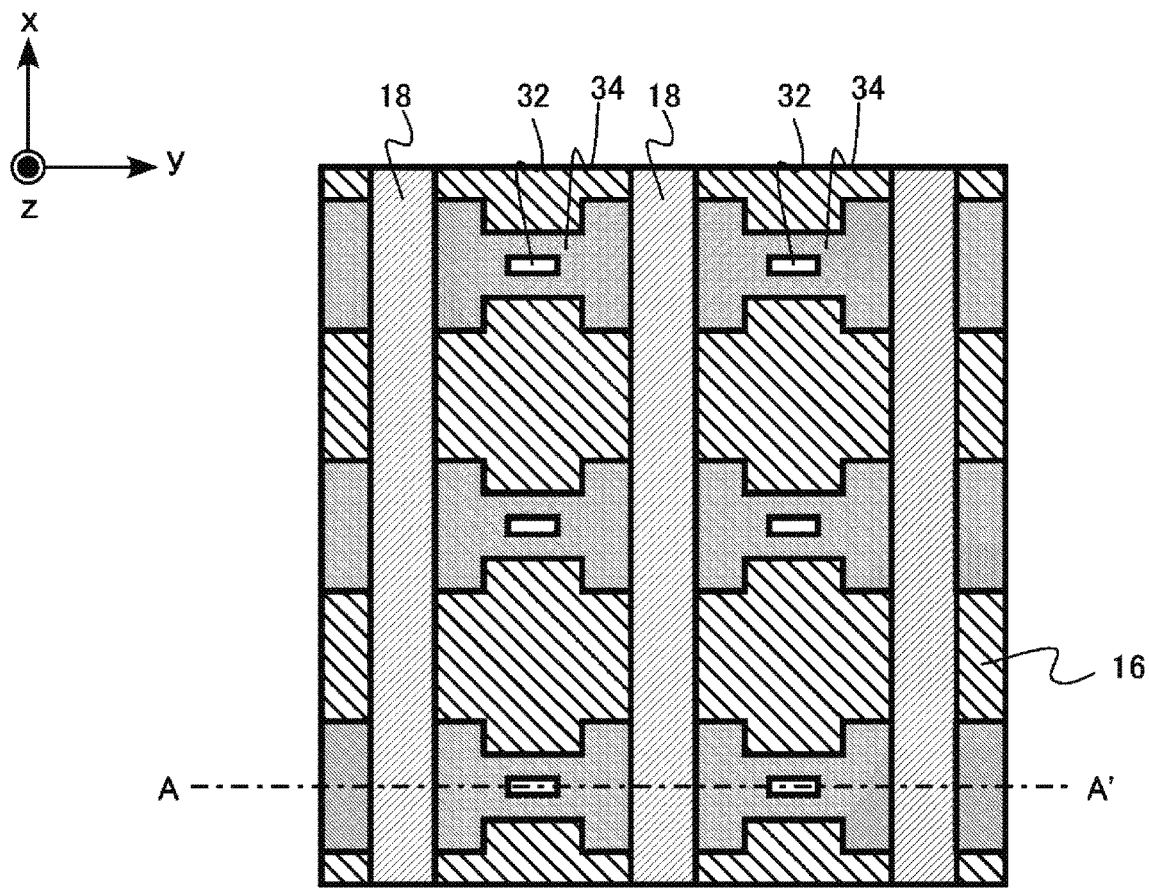
FIG. 11A and FIG. 11B are schematic sectional views illustrating one or more embodiments of the storage device during manufacturing in the method of manufacturing the storage device according to the first aspect.
Figure 11B:
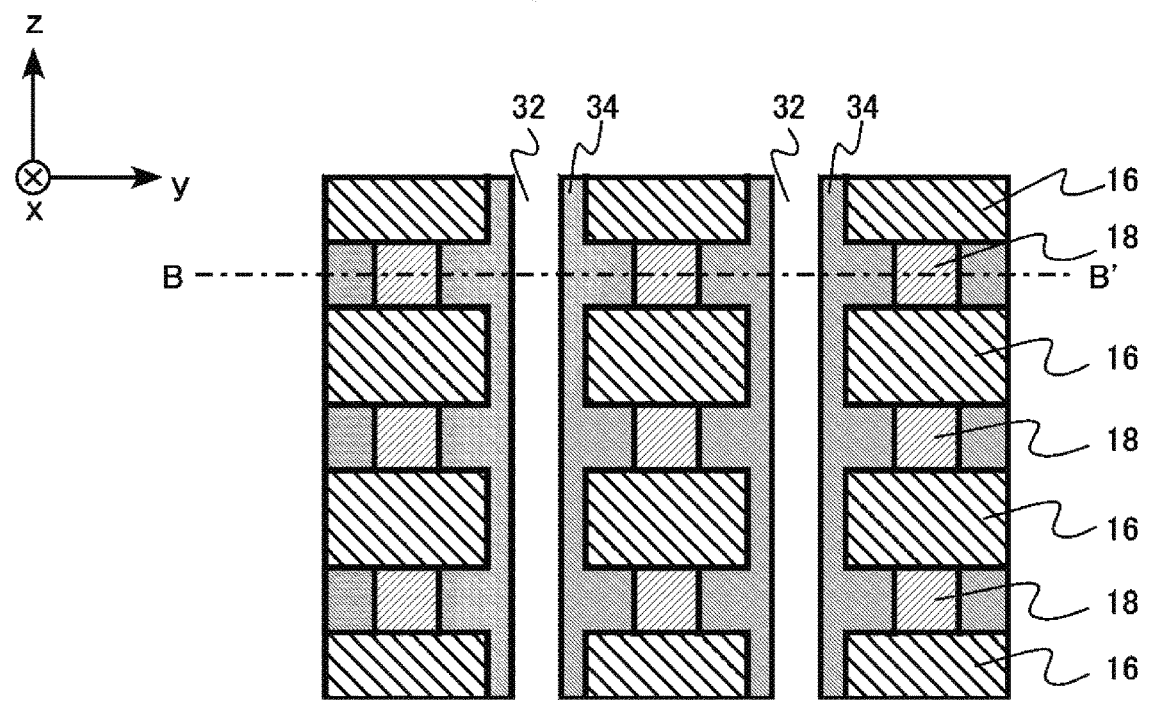

Subsequently, the conductive films 18 are narrowed by etching performed at side surfaces of the conductive films 18 that define the openings 32 (see FIG. 10A and FIG. 10B)

Subsequently, variable resistance films 34 are deposited inside the openings 32 (see FIG. 11A and FIG. 11B) such that a portion of the openings 32 remain (e.g. a portion surrounded by the variable resistance films 34). In other words, the variable resistance films 34 may now define the openings 32. The variable resistance film 34 is, for example, an amorphous $Ge_2Sb_2Te_5$ alloy film. The variable resistance films 34 are deposited by, for example, an atomic layer deposition method (ALD method).

Figure 12A:
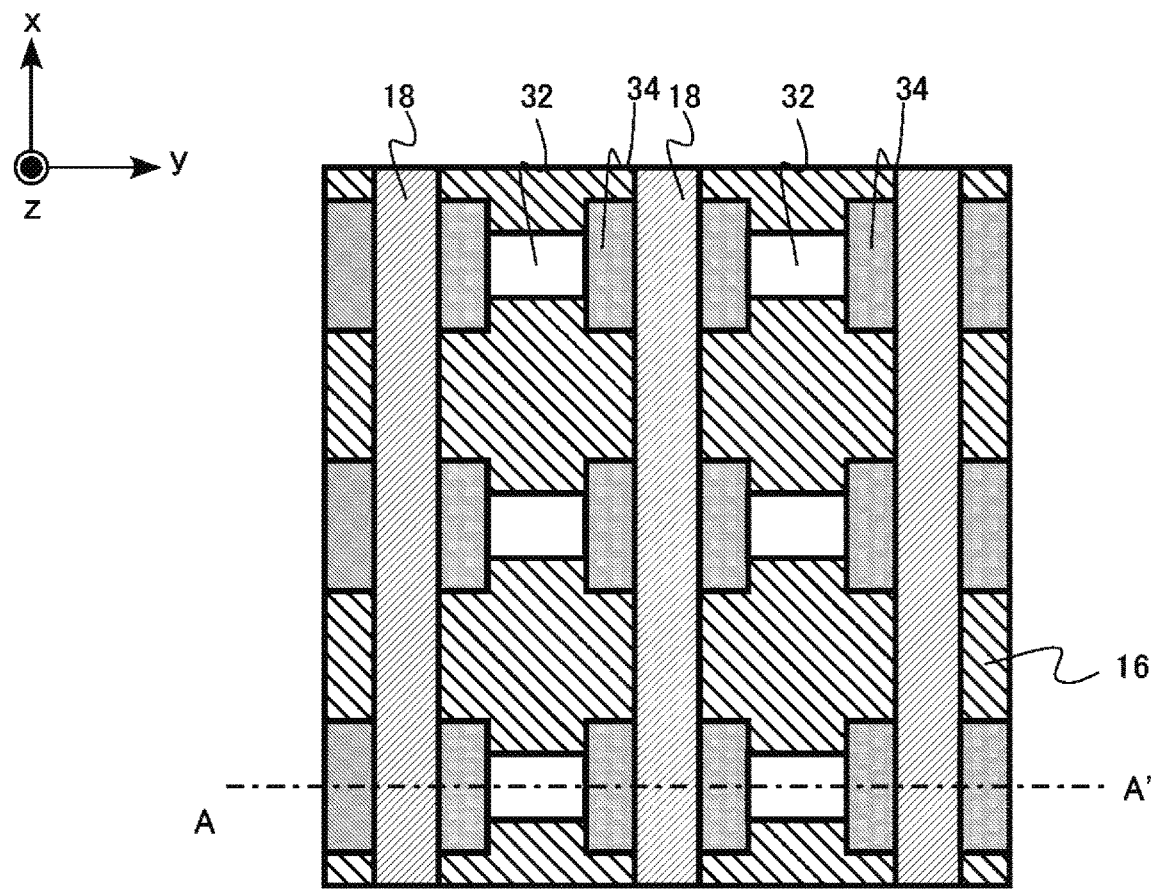
FIG. 12A and FIG. 12B are schematic sectional views illustrating one or more embodiments of the storage device during manufacturing in the method of manufacturing the storage device according to the first aspect.
Figure 12B:
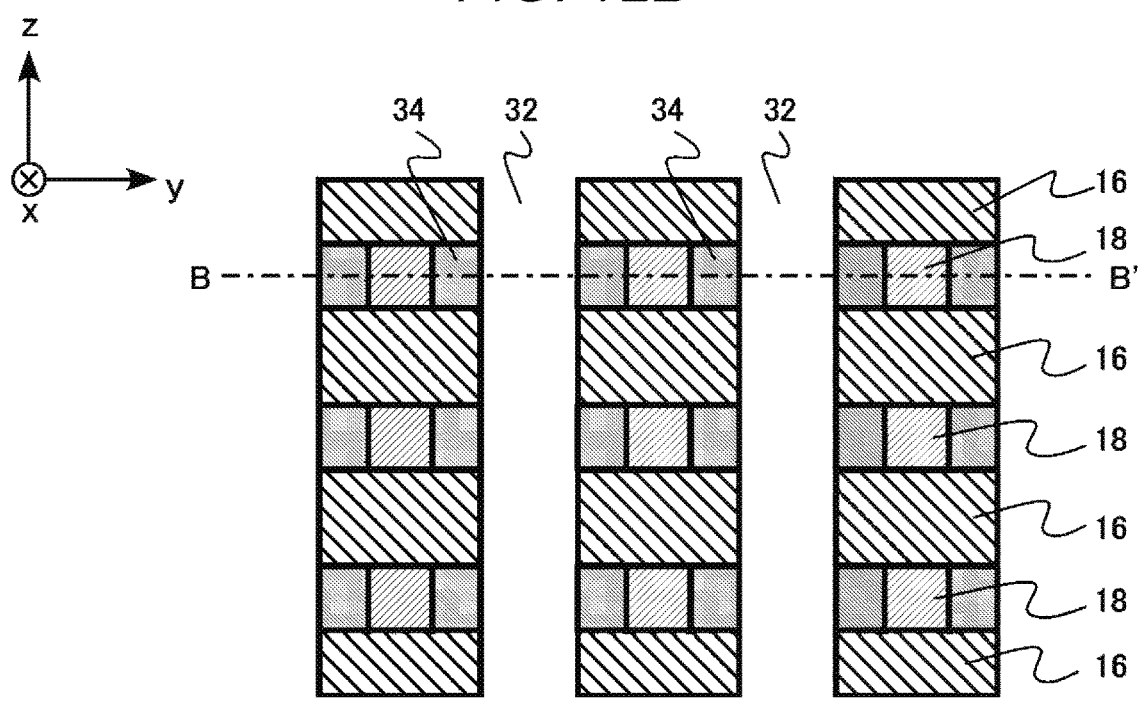

Subsequently, the variable resistance films 34 that define the openings 32 are removed by etching such that a middle portion of the variable resistance films 34 are removed, thus separating the variable resistance films 34 into two portions respectively disposed on side surfaces of respective conductive films 18 (see FIG. 12A and FIG. 12B). The etching of the variable resistance films 34 is performed by, for example, isotropic dry etching.

Figure 13A:
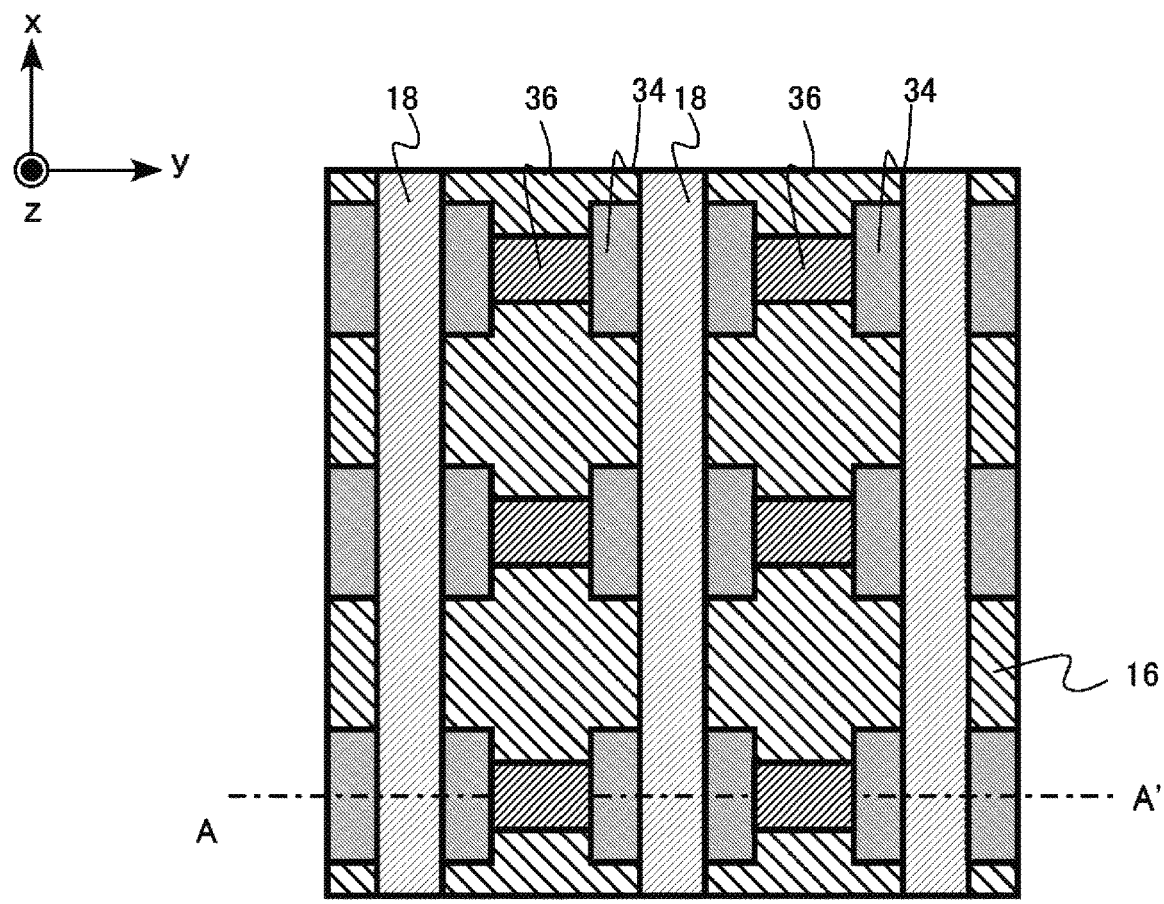
FIG. 13A and FIG. 13B are schematic sectional views illustrating one or more embodiments of the storage device during manufacturing in the method of manufacturing the storage device according to the first aspect.
Figure 13B:
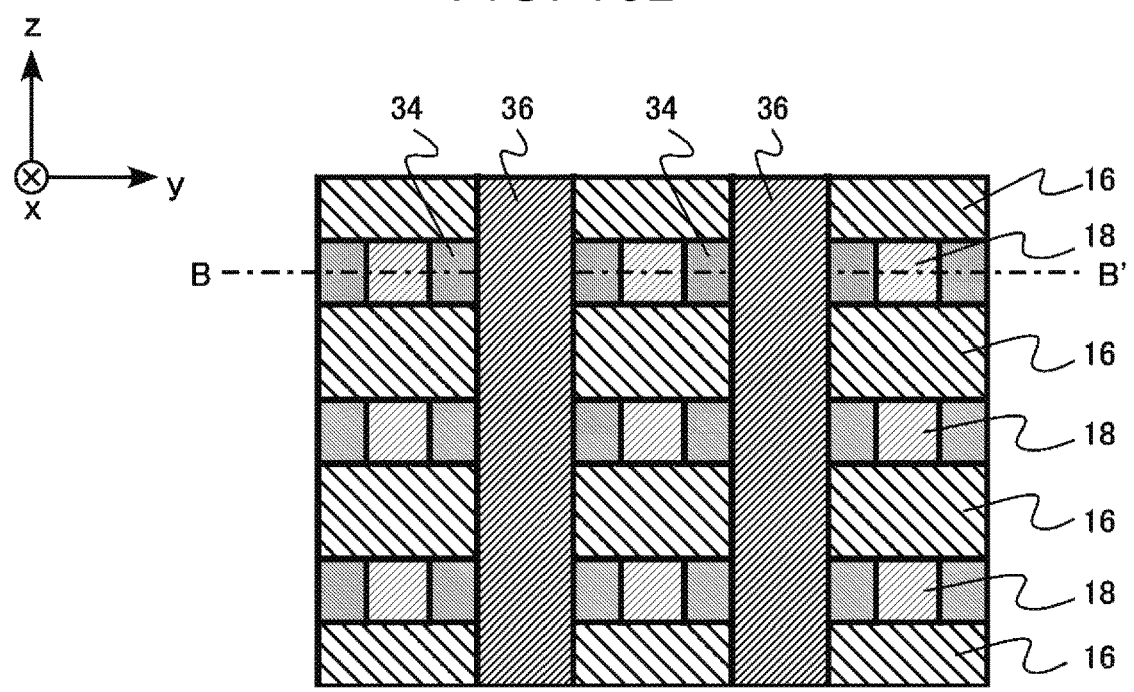

Subsequently, the openings 32 are at least partially filled with conductive films 36 (see FIG. 13A and FIG. 13B). The conductive film 36 is, for example, a titanium nitride film. The conductive films 36 are deposited by, for example, a CVD method.

According to the foregoing manufacturing method, the memory cell array 10 of one or more embodiments of the storage device 100 according to the first aspect illustrated in FIG. 3A and FIG. 3B is manufactured.

According to the foregoing manufacturing method, the structure of the variable resistance films 34 and the conductive films 36 is formed with self-alignment with the patterns of the conductive films 18 and the insulating films 16 patterned so that the side surfaces are formed to be uneven. Accordingly, a structure of the variable resistance films 34 and the conductive films 36 finer than some comparative processing limits (e.g. corresponding to a processing precision of some comparative lithographic methods or the like) can be formed. Accordingly, it is possible to readily realize fine structure of the memory cell MC. For example, it is possible to achieve a fine width of the bit line BL in the x direction (w1 in FIG. 4).

Next, operational effects of one or more embodiments of the storage device 100 according to the first aspect will be described.

With the fine variable resistance memory components, a distance between adjacent memory cells MC is shortened, and thus mutual interference between the adjacent memory cells MC can be problematic. The mutual interference between the adjacent memory cells can be a cause of an erroneous operation. For example, in phase-change memories in which resistivity of the variable resistance layer in a high resistance state is relatively low, when the variable resistance layer is continuous between the adjacent memory cells MC, a leakage current flows between the memory cells MC, and thus mutual interference readily occurs. In addition, an unintended current path via the variable resistance layer can be generated, and thus there is a problem that a stray current is generated.

In one or more embodiments of the storage device 100 according to the first aspect, the variable resistance layers R of the memory cells MC are separated from each other. For example, the first variable resistance layer R1, the second variable resistance layer R2, the third variable resistance layer R3, and the fourth variable resistance layer R4 are separated from each other with the interlayer insulating layers 20 interposed therebetween. Accordingly, a leakage current is prevented from flowing between the variable resistance layers R. Accordingly, the above-described erroneous operation of the memory cell MC are less likely to occur. For example, it is difficult to generate a stray current via the variable resistance layer.

In one or more embodiments of the storage device 100 according to the first aspect, the first distance (d1 in FIG. 4) between the first variable resistance layer R1 and the second variable resistance layer R2 is shorter than the second distance (d2 in FIG. 4) between a part of the word line WL11 and a part of the word line WL12 which face each other across a region (C in FIG. 4) provided between the bit lines BL11 and BL21. In this structure, the first variable resistance layer R1 and the fourth variable resistance layer R4 adjacent in the x direction are separated from each other. In addition, the third distance (d3 in FIG. 4) between another part of the word line WL11 and another part of the word line WL12 which face each other with the bit line BL11 interposed therebetween can be equal to or shorter than the second distance (d2 in FIG. 4). Thus, in one or more embodiments the first variable resistance layer R1 and the fourth variable resistance layer R4 are separated from each other without thinning the width of the word line WL11 or the word line WL12 in a region adjacent to the bit line BL11. Accordingly, the separation between the variable resistance layers R can be realized without increasing wiring resistance of the word lines WL.

In the variable resistance memory, to change the variable resistance layer from the low resistance state to the high resistance state (a reset operation) or change the variable resistance layer from the high resistance state to the low resistance state (a set operation), a current with a predetermined current density can be directed to the variable resistance layer. In particular, in phase-change memories, high current density may be used for a reset operation. When the current density is insufficient, a reset operation can become unstable.

In one or more embodiments of the storage device 100 according to the first aspect, the width of the bit line BL11 in the x direction (w1 in FIG. 4) is less than the width of the first variable resistance layer R1 in the x direction (w2 in FIG. 4). In this structure, a contact area between the bit line BL and the variable resistance layer R is small, and thus it is possible to increase current density at the time of the reset operation. Accordingly, the reset operation is stabilized. In some implementations, to promote increasing the current density at the time of the reset operation, the width of the bit line BL11 in the x direction can be set to be equal to or less than about half of the width of the first variable resistance layer R1 in the x direction.

In one or more embodiments of the storage device 100 according to the first aspect, the width of the bit line BL11 in the x direction (w1 in FIG. 4) is less than the width of the bit line BL11 in the y direction (w3 in FIG. 4). In this structure, the contact area between the bit line BL and the variable resistance layer R is small, and thus it is possible to increase the current density at the time of the reset operation. Accordingly, the reset operation is stabilized. In some implementations, to promote increasing the current density at the time of the reset operation, the width of the bit line BL11 in the x direction can be set to be equal to or less than about half of the width of the bit line BL11 in the y direction.

In some implementations, to promote increasing the amount of a current flowing to the memory cell MC at the time of the reset operation, the wiring resistance of the word line WL can be set to be low. A material with low resistivity can be included in the word line WL to provide for this. The resistivity of the word line WL is can be set to be lower than the resistivity of the bit line BL.

Figure 14:
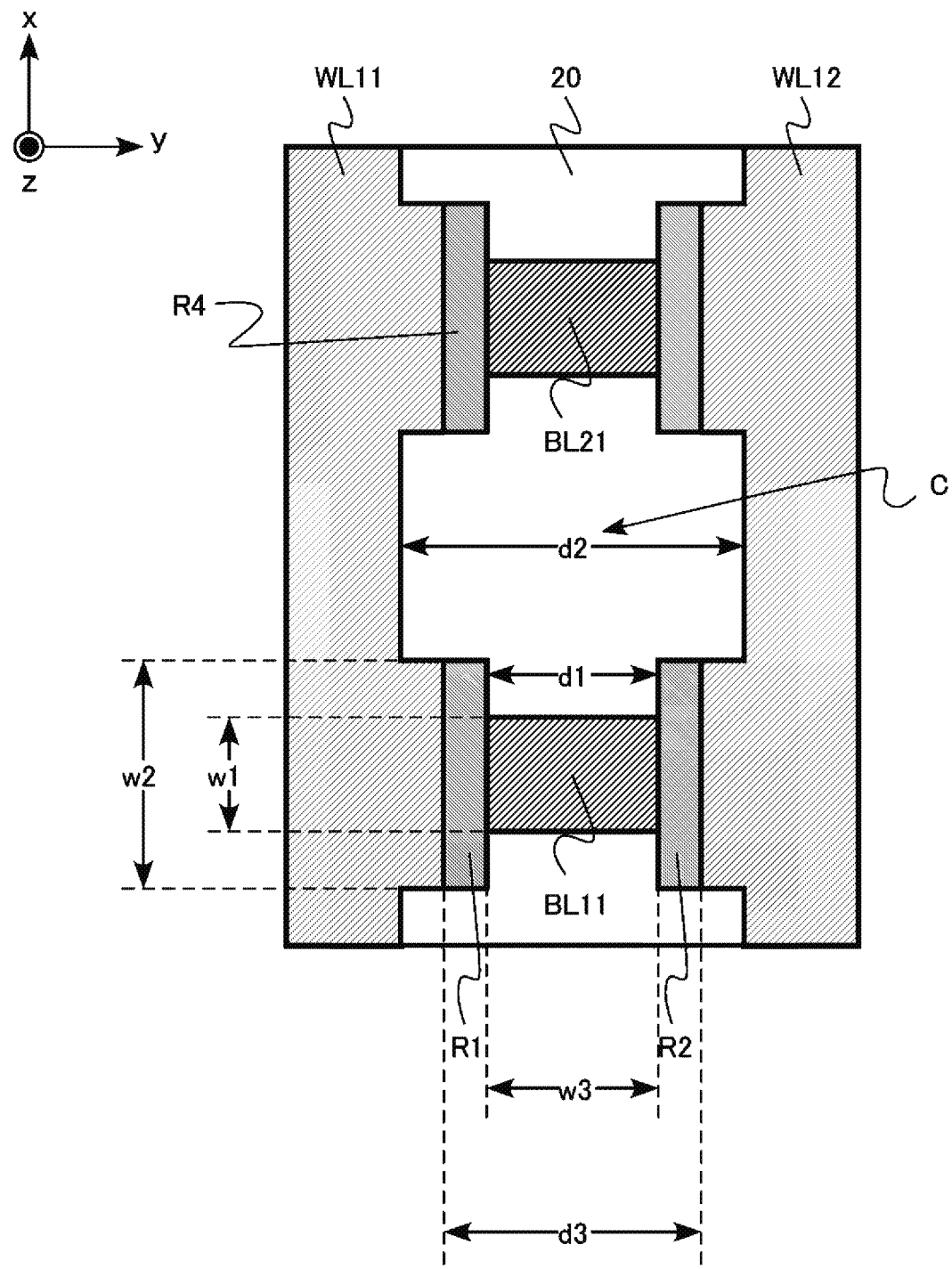
FIG. 14 is an expanded schematic sectional view illustrating one or more embodiments of a storage device according to a modification example of the first aspect.

FIG. 14 is an expanded schematic sectional view illustrating a storage device according to a modification example of the first aspect. In the storage device according to the modification example of the first aspect, the third distance (d3 in FIG. 4) between another part of the word line WL11 and another part of the word line WL12 which face each other with the bit line BL11 interposed therebetween is shorter than the second distance (d2 in FIG. 4). The widths of the word lines WL11 and WL12 are thicker in at least one of a portion adjacent to the bit line BL11 and a portion adjacent to the bit line BL21 than in a portion of the word lines WL11 and WL12 disposed between the bit lines BL11 and BL21. According to the modification example of the first aspect, it is possible to decrease the wiring resistance of the word line WL.

As described above, according to the first aspect, it is possible to prevent the mutual interference between the memory cells MC or the stray current. It is possible to increase the current density at the time of the reset operation. It is possible to prevent the wiring resistance of the word line from increasing. Thus, it is possible to realize the storage device 100 capable of stabilizing the characteristics of the memory cells MC.

Second Aspect

In one or more embodiments of the storage device according to the second aspect is a phase-change memory. In one or more embodiments, the structure of the memory cell array according to the second aspect is the same as or similar to one or more embodiments according to the first aspect, except for some structural differences described below. Accordingly, redundant description of components or structures included in devices according to the first aspect will not be provided.

Figure 15A:
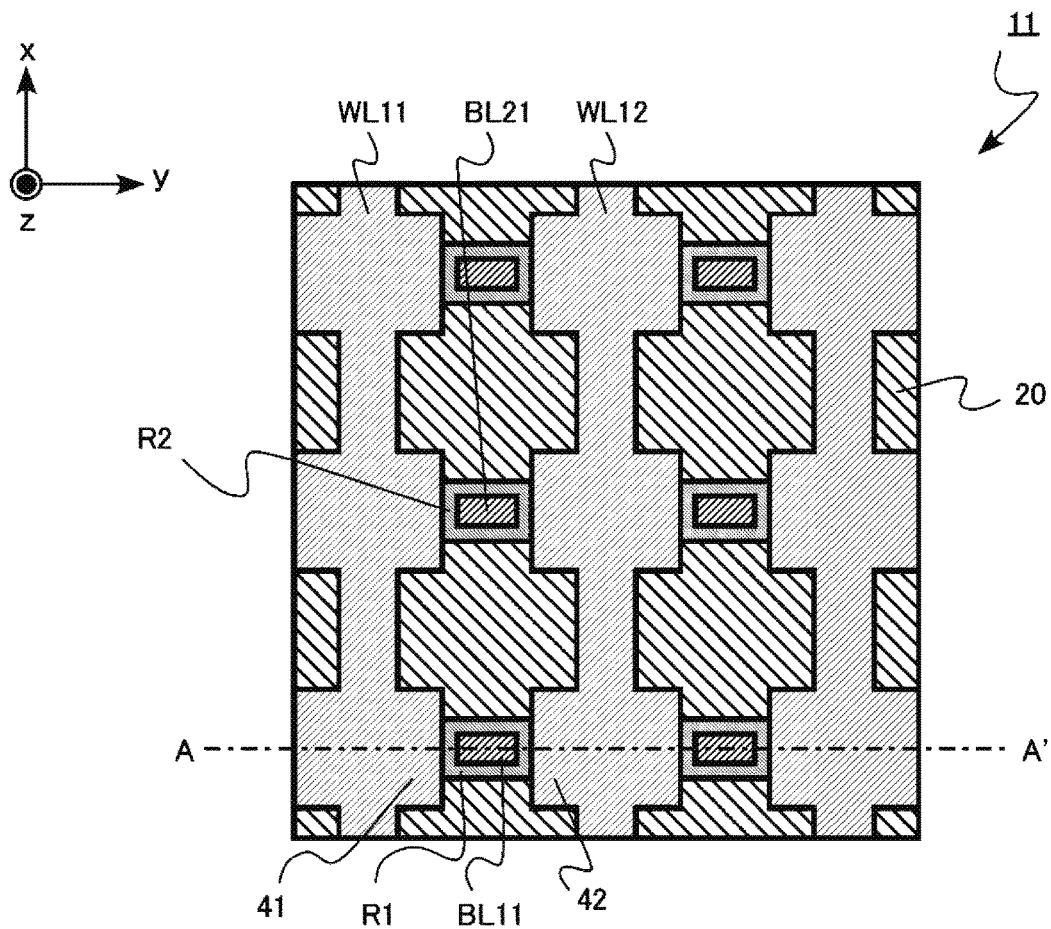
FIG. 15A and FIG. 15B are schematic sectional views illustrating one or more embodiments of a storage device according to a second aspect.
Figure 15B:
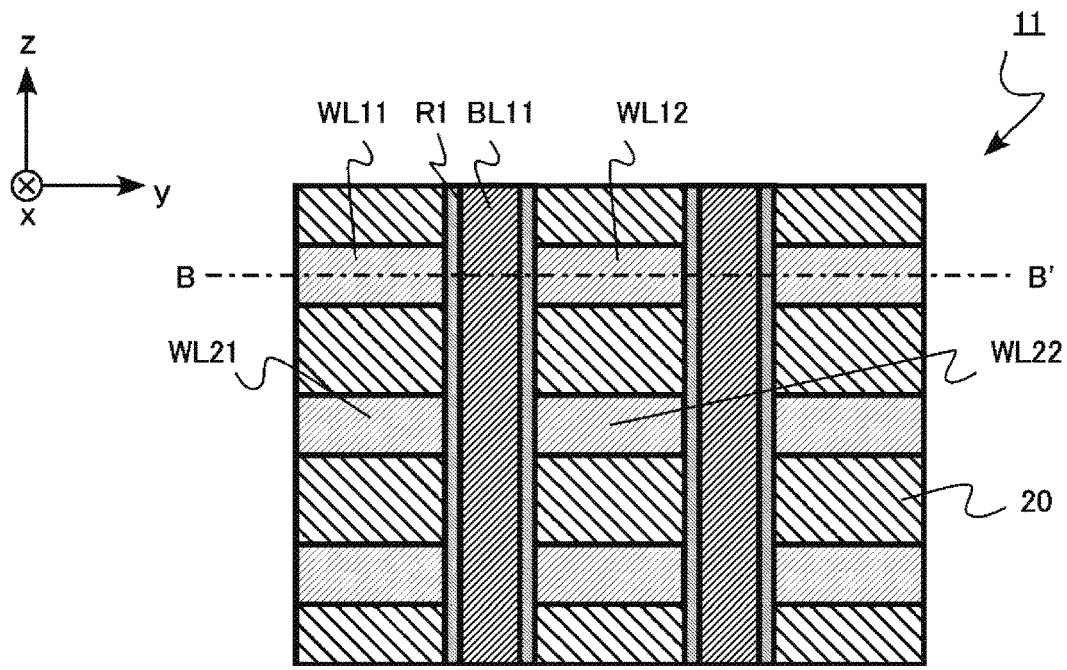

FIG. 15A and FIG. 15B are schematic sectional views illustrating one or more embodiments of a memory cell array 11 of the storage device according to the second aspect. FIG. 15A is an xy sectional view illustrating the memory cell array 11. FIG. 15B is an yz sectional view illustrating the memory cell array 11. FIG. 15A is the sectional view taken along the line BB' in FIG. 15B, and FIG. 15B is the sectional view taken along the line AA' in FIG. 15A. In FIG. 15A and FIG. 15B, a region surrounded by a dotted line is one memory cell MC.

The memory cell array 11 includes the word line WL11 (the first conductive layer), the word line WL12 (the second conductive layer), the word line WL21 (the third conductive layer), and the word line WL22 (the fourth conductive layer). The word line WL11 includes a first projection region 41 and the word line WL12 includes a second projection region 42. The memory cell array 11 includes the bit line BL11 (the fifth conductive layer) and the bit line BL21 (the sixth conductive layer). The memory cell array 11 includes a first variable resistance layer R1 and a second variable resistance layer R2. The memory cell array 11 includes interlayer insulating layers 20.

The first variable resistance layer R1 is provided between the word line WL11 and the bit line BL11, between the word line WL12 and the bit line BL11, between the word line WL21 and the bit line BL11, and between the word line WL22 and the bit line BL11. The second variable resistance layer R2 is provided between the word line WL11 and the bit line BL21, between the word line WL12 and the bit line BL21, between the word line WL21 and the bit line BL21, and between the word line WL22 and the bit line BL21.

Figure 16:
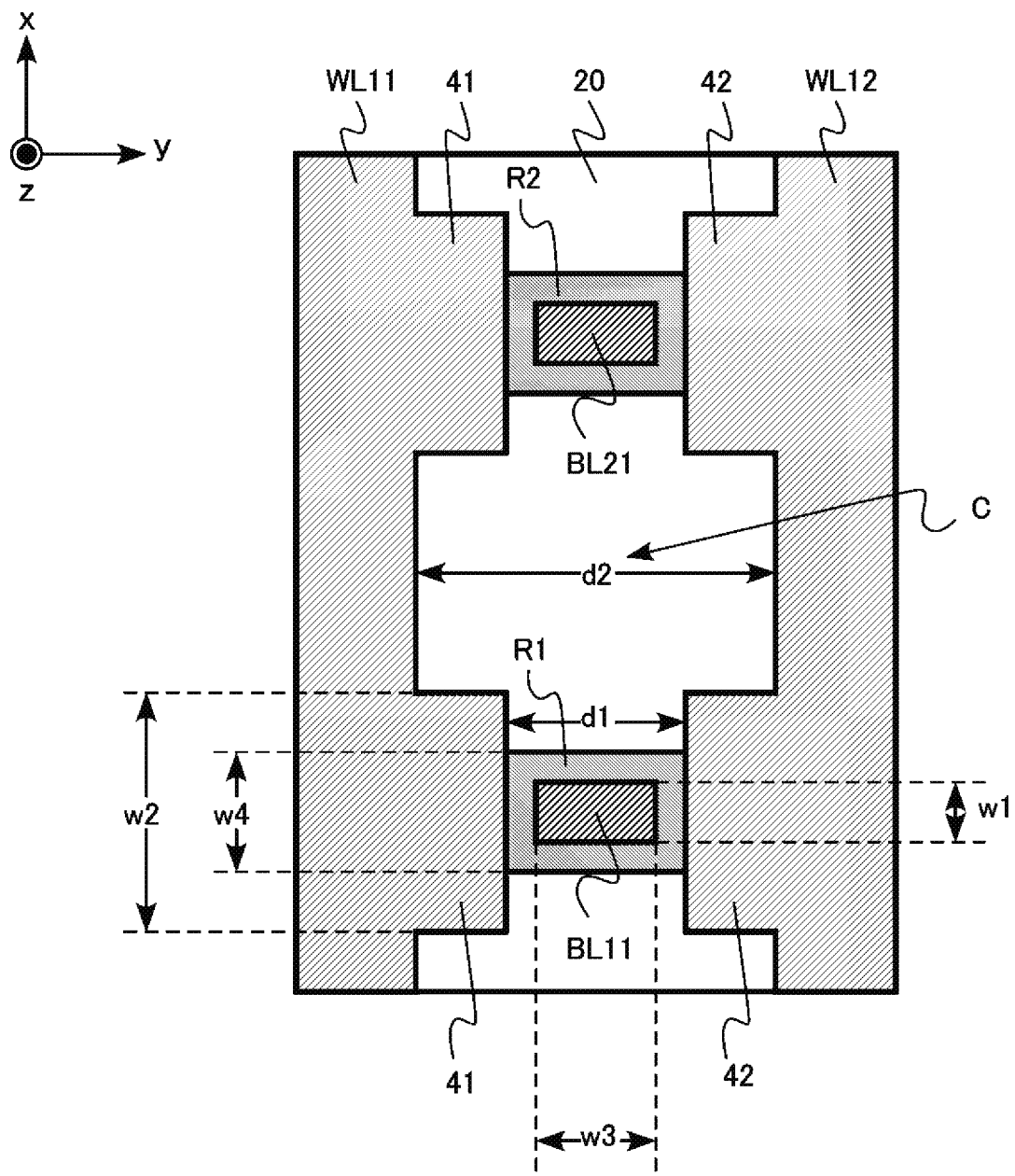
FIG. 16 is an expanded schematic sectional view illustrating one or more embodiments of the storage device according to the second aspect.

FIG. 16 is an expanded schematic sectional view illustrating one or more embodiments of the storage device according to the second aspect. FIG. 16 is the expanded schematic sectional view illustrating a region of FIG. 15A. The bit line BL11 is interposed between a part of the word line WL11 and a part of the word line WL12 facing the word line WL11. The region C provided between the bit lines BL11 and BL21, and is interposed between another part of the word line WL11 and another part of the word line WL12 facing the word line WL11 across the region C. A first distance (d1 in FIG. 16) between the part of the word line WL11 and the part of the word line WL12 is shorter than a second distance (d2 in FIG. 16) between the other part of the word line WL11 and the other part of the word line WL12. In other words, a distance between the first projection region 41 and the second projection region 42 is shorter than a distance between the word line WL11 of a region other than the first projection region 41 and the word line WL12 of a region other than the second projection region 42.

Further, a width of the bit line BL11 in the x direction (w1 in FIG. 16) is less than a width of the first projection region 41 in the x direction (w2 in FIG. 16).

A width of the bit line BL11 in the x direction (w1 in FIG. 16) is less than a width of the bit line BL11 in the y direction (w3 in FIG. 16). The width of the bit line BL11 in the x direction is, for example, equal to or less than about half of the width of the bit line BL11 in the y direction.

The width of the bit line BL11 in the x direction (w1 in FIG. 16) is less than a width of the first variable resistance layer R1 in the x direction (w4 in FIG. 16). The width of the bit line BL11 in the x direction is, for example, equal to or less than about half of the width of the first variable resistance layer R1 in the x direction.

The width of the first variable resistance layer R1 in the x direction (w4 in FIG. 16) is less than the width of the first projection region 41 in the x direction (w2 in FIG. 16).

Figure 17A:
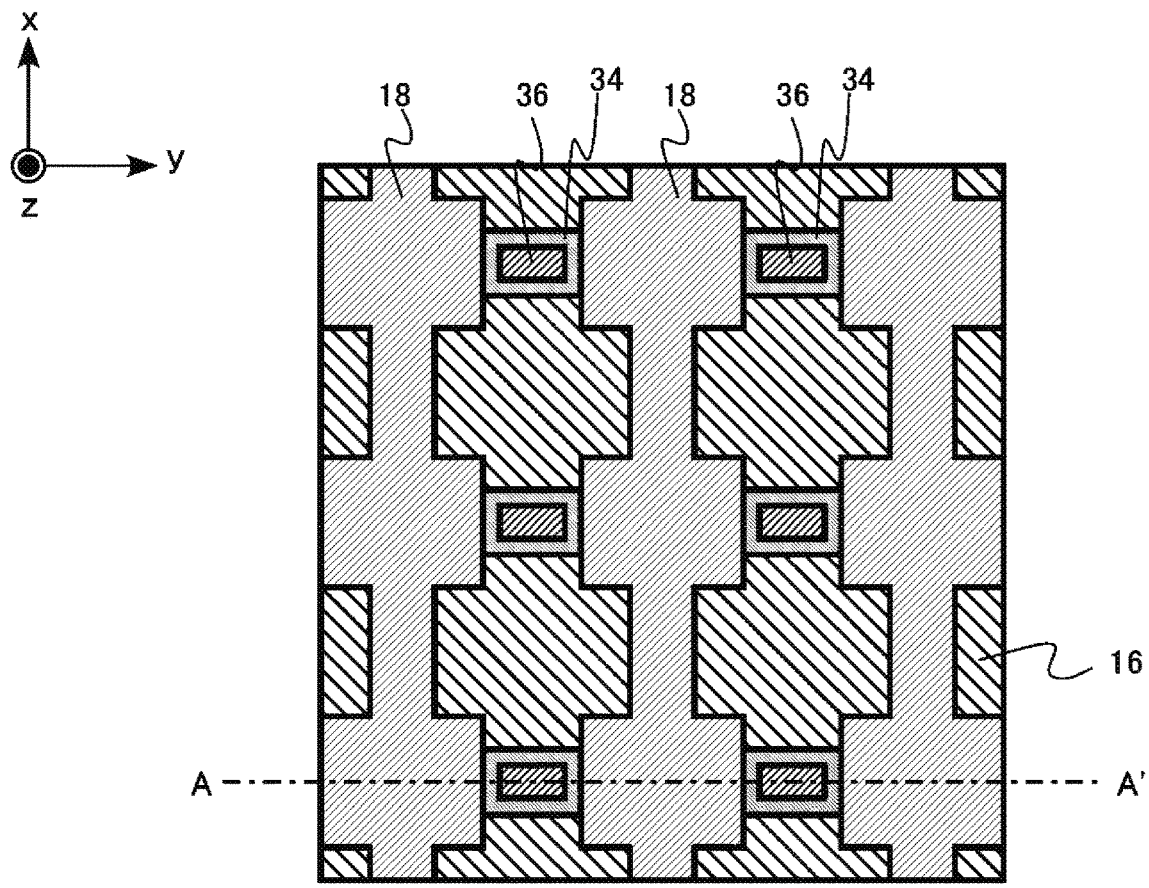
FIG. 17A and FIG. 17B are schematic sectional views illustrating one or more embodiments of the storage device during manufacturing in a method of manufacturing the storage device according to the second aspect.
Figure 17B:
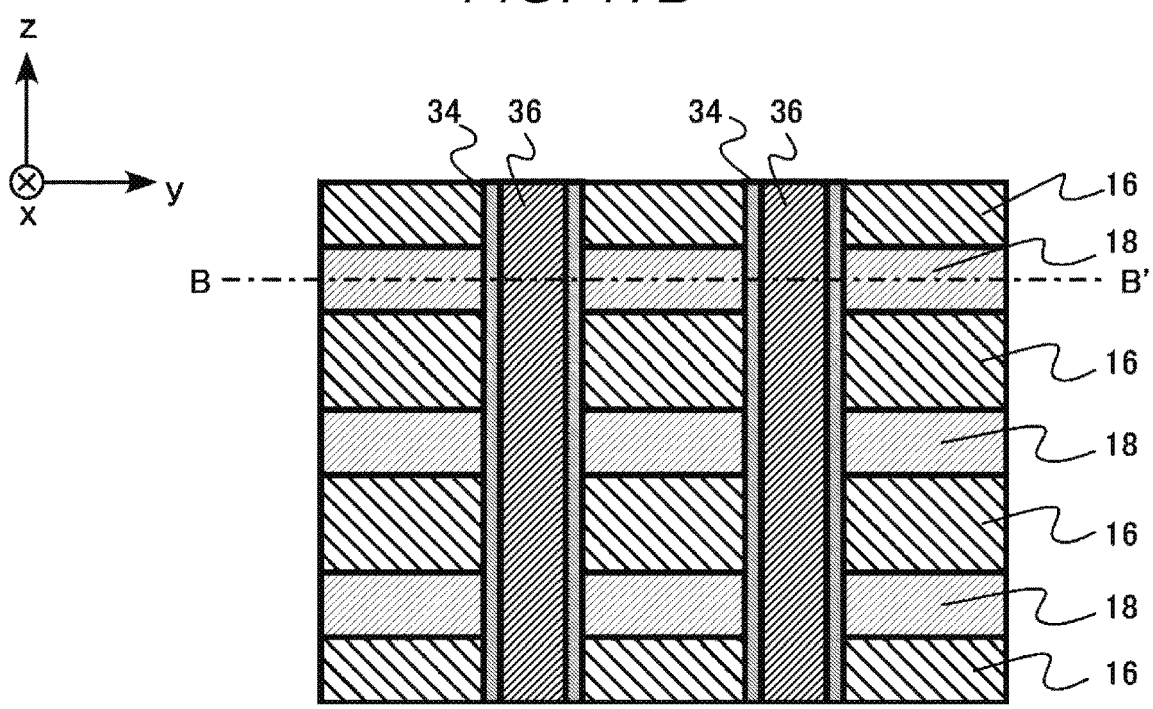

Next, one or more embodiments of a method of manufacturing the storage device according to the second aspect will be described. FIG. 17A and FIG. 17B are schematic sectional views illustrating one or more embodiments of the storage device during manufacturing in the method of manufacturing the storage device according to the second aspect. FIG. 17A is a sectional view illustrating portions corresponding to FIG. 15A. FIG. 17B is a sectional view illustrating portions corresponding to FIG. 15B.

Figure 9A:
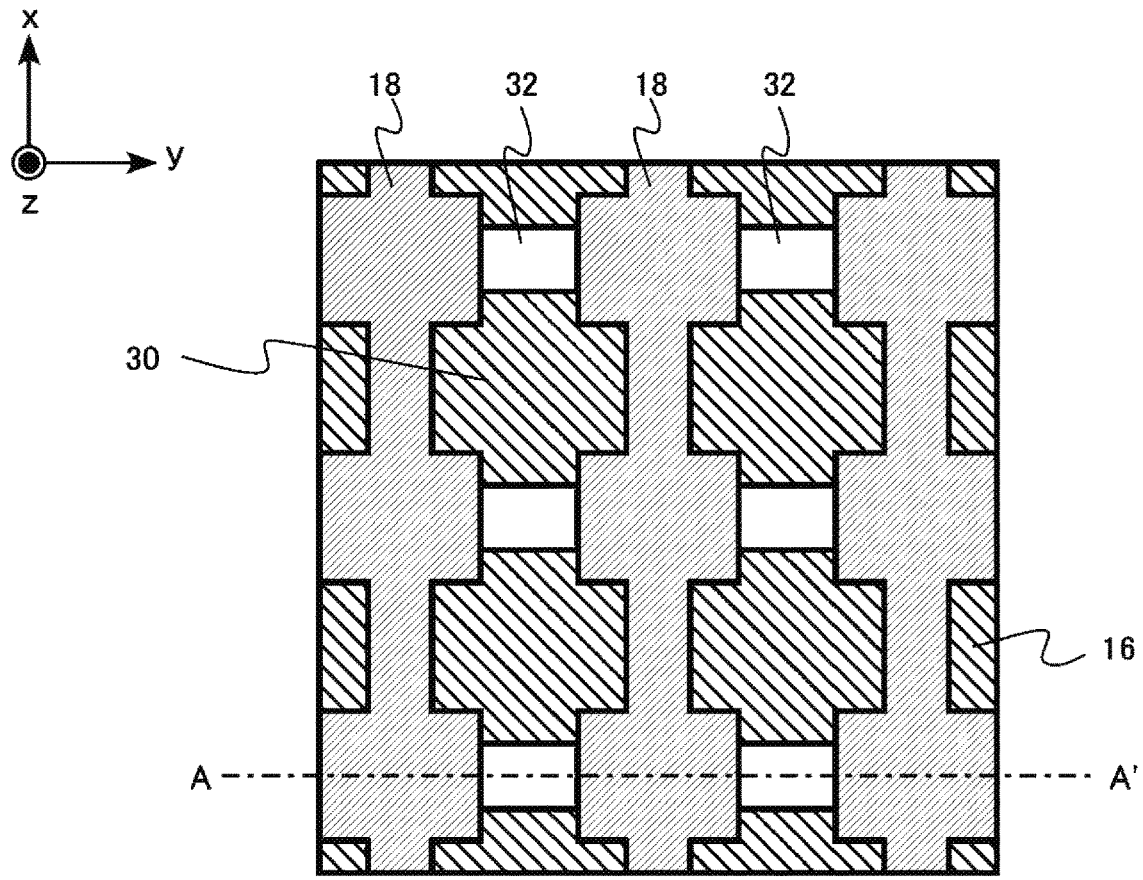
FIG. 9A and FIG. 9B are schematic sectional views illustrating one or more embodiments of the storage device during manufacturing in the method of manufacturing the storage device according to the first aspect.
Figure 9B:
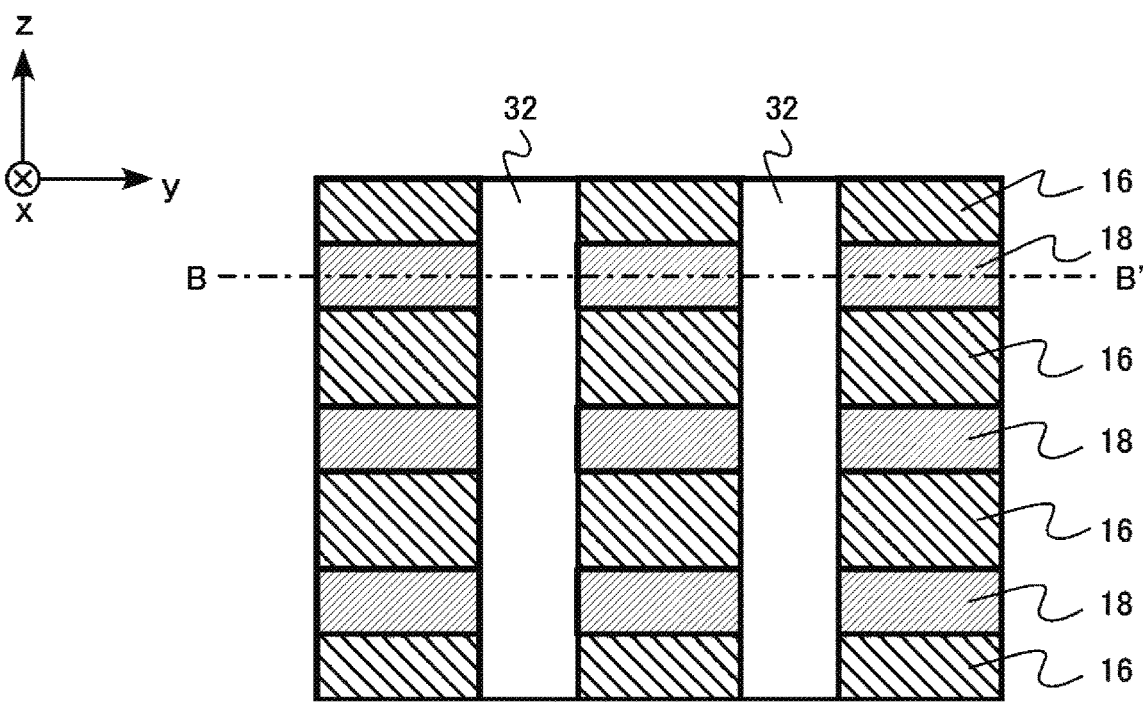

In one or more embodiments, the method of manufacturing the storage device according to the second aspect is the same as or similar to one or more embodiments of the manufacturing method according to the first aspect following the removing of the pillar regions 24a by etching to form the openings 32 (see FIG. 9A and FIG. 9B).

Subsequently, the variable resistance films 34 are deposited into a portion of the openings 32 (thereby shrinking the openings 32) and subsequently, the openings 32 are at least partially filled with the conductive films 36 (see FIGS. 17A and 17B). The variable resistance film 34 is, for example, an amorphous $Ge_2Sb_2Te_5$ alloy film. The variable resistance films 34 are deposited by, for example, an atomic layer deposition method (ALD method). The conductive film 36 is, for example, a titanium nitride film. The conductive films 36 are deposited by, for example, a CVD method.

According to the foregoing manufacturing method, one or more embodiments of the memory cell array 11 of the storage device according to the second aspect illustrated in FIG. 15A and FIG. 15B is manufactured.

According to the foregoing manufacturing method, the structure of the variable resistance films 34 and the conductive films 36 is formed with self-alignment with the patterns of the conductive films 18 and the insulating films 16 patterned so that the side surfaces are formed to be uneven. Accordingly, the structure of the variable resistance films and the conductive films 36 can be finer than some comparative processing limits corresponding to a processing precision of some comparative lithographic methods or the like. Accordingly, it is possible to realize fineness of the memory cell MC. For example, it is possible to achieve a fine width of the bit line BL in the x direction (w1 in FIG. 16).

Next, operational effects of one or more embodiments of the storage device according to the second aspect will be described.

In the variable resistance memory, to change the variable resistance layer from the low resistance state to the high resistance state (a reset operation) or change the variable resistance layer from the high resistance state to the low resistance state (a set operation), a current with a predetermined current density can be directed to the variable resistance layer. In particular, in phase-change memories, a high current density may be used for a reset operation. When the current density is insufficient, the reset operation can become unstable.

In one or more embodiments of the storage device according to the second aspect, the width of the bit line BL11 in the x direction (w1 in FIG. 4) is less than the width of the first variable resistance layer R1 in the x direction (w2 in FIG. 4). In this structure, by decreasing a contact area between the bit line BL and the variable resistance layer R, it is possible to increase current density at the time of the reset operation. Accordingly, the reset operation is stabilized. In some implementations, to promote increasing the current density at the time of the reset operation, the width of the bit line BL11 in the x direction can be set to be equal to or less than about half of the width of the first variable resistance layer R1 in the x direction.

In one or more embodiments of the storage device according to the second aspect, the width of the bit line BL11 in the x direction (w1 in FIG. 16) is less than the width of the first projection region 41 in the x direction (w2 in FIG. 16). In addition, the width of the bit line BL11 in the x direction (w1 in FIG. 16) is less than the width of the bit line BL11 in the y direction (w3 in FIG. 16). In this structure, by decreasing the contact area between the bit line BL and the variable resistance layer R, it is possible to increase the current density at the time of the reset operation. Accordingly, the reset operation is stabilized. In some implementations, to promote increasing the current density at the time of the reset operation, the width of the bit line BL11 in the x direction can be set to be equal to or less than about half of the width of the bit line BL11 in the y direction.

In one or more embodiments of the storage device according to the second aspect, the word line WL includes one or more projection regions, and thus an effective wiring resistance is lowered.

Figure 18:
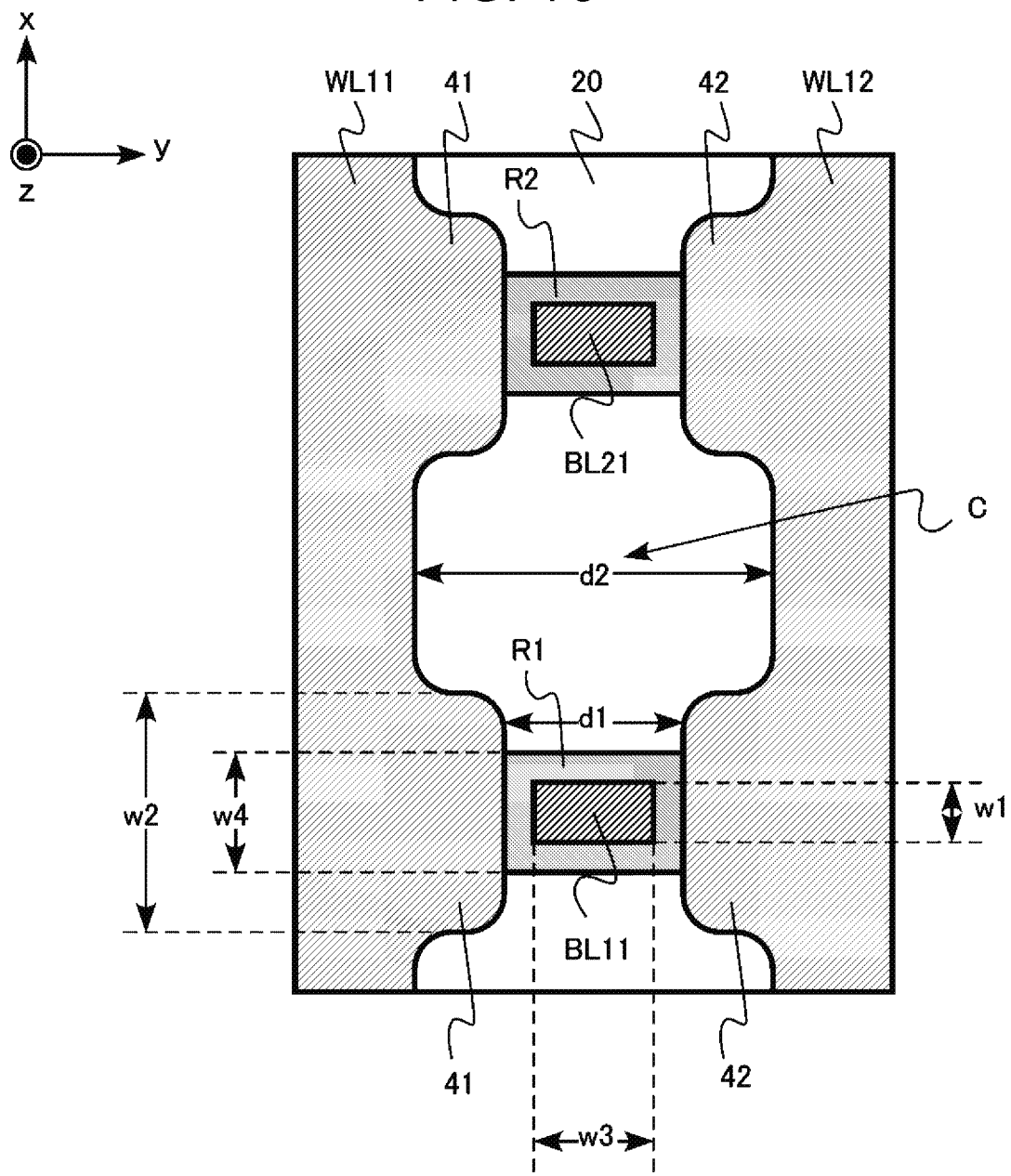
FIG. 18 is an expanded schematic sectional view illustrating one or more embodiments of a storage device according to a modification example of the second aspect.

FIG. 18 is an expanded schematic sectional view illustrating one or more embodiments of the storage device according to a modification example of the second aspect. In the storage device according to the modification example of the second aspect, an end portion of the word line WL has a curved surface. For example, one or more corner portions of the protruding regions may be curved or rounded.

As described above, in one or more embodiments according to the second aspect, it is possible to increase the current density at the time of the reset operation. It is possible to lower the wiring resistance of the word line. Thus, it is possible to realize the storage device capable of stabilizing the characteristics of the memory cells MC.

In the first and second embodiments, the phase-change memory has been described as an example, but the present disclosure can also be applied to other variable resistance memories. For example, the present disclosure can also be applied to a phase-change memory in which a variable resistance layer has a superlattice structure and a variable resistance memory in which a vacancy-modulated conductive oxide film is used.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described, these embodiments have been presented byway of example only, and are not intended to limit the scope of the present disclosure. Indeed, the embodiments described herein may be embodied in a variety of other forms and may be combined; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device comprising:
   a substrate having a surface;
   a first conductive layer disposed on the surface of the substrate and extending in a first direction parallel to the surface of the substrate;
   a second conductive layer disposed adjacent to the first conductive layer in a second direction crossing the first direction, and extending in the first direction;
   a third conductive layer disposed adjacent to the first conductive layer in a third direction perpendicular to the surface of the substrate, and extending in the first direction;
   a fourth conductive layer disposed adjacent to the third conductive layer in the second direction, and extending in the first direction;
   a fifth conductive layer extending in the third direction and provided between the first conductive layer and the second conductive layer and between the third conductive layer and the fourth conductive layer;
   a sixth conductive layer extending in the third direction and provided between the first conductive layer and the second conductive layer and between the third conductive layer and the fourth conductive layer;
   a first variable resistance layer provided between the first conductive layer and the fifth conductive layer;
   a second variable resistance layer provided between the second conductive layer and the fifth conductive layer;
   a third variable resistance layer provided between the third conductive layer and the fifth conductive layer; and
   a fourth variable resistance layer provided between the first conductive layer and the sixth conductive layer,
   wherein the first variable resistance layer, the second variable resistance layer, the third variable resistance layer, and the fourth variable resistance layer are separated from each other,
   a first distance between the first variable resistance layer and the second variable resistance layer in the second direction is shorter than a second distance between a portion of the first conductive layer and a portion of the second conductive layer which face each other across a region between the fifth conductive layer and the sixth conductive layer,
   a width of the fifth conductive layer in the first direction is less than a width of the first variable resistance layer in the first direction, and
   a width of the fifth conductive layer in the first direction is less than a width of the fifth conductive layer in the second direction.

2. The storage device according to claim 1, wherein a third distance between another portion of the first conductive layer and another portion of the second conductive layer which face each other with the fifth conductive layer interposed therebetween is equal to or shorter than the second distance.

3. The storage device according to claim 1, wherein the first variable resistance layer comprises at least one of germanium, antimony, or tellurium.

4. The storage device according to claim 1, wherein a resistivity of the first conductive layer is lower than a resistivity of the fifth conductive layer.

5. The storage device according to claim 1, wherein the first conductive layer comprises tungsten or titanium nitride.

6. The storage device according to claim 1, wherein the fifth conductive layer comprises tungsten, titanium nitride, or copper.

7. The storage device according to claim 1, wherein the second distance is equal to or shorter than about 50 nm.

8. The storage device according to claim 1, wherein a thickness of the first conductive layer in the third direction is equal to or less than about 20 nm.

* * * * *